(12) United States Patent
Chen et al.

(10) Patent No.: US 7,879,673 B2
(45) Date of Patent: Feb. 1, 2011

(54) PATTERNING NANOCRYSTAL LAYERS

(75) Inventors: Yu Chen, Singapore (SG); Jae Gon Lee, Singapore (SG); Vincent Ho, Singapore (SG); Bangun Indajang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/436,793

(22) Filed: May 7, 2009

(65) Prior Publication Data

US 2010/0283101 A1 Nov. 11, 2010

(51) Int. Cl.
*H01L 21/00* (2006.01)
*H01L 21/336* (2006.01)

(52) U.S. Cl. .................................. 438/257; 438/694
(58) Field of Classification Search ................ 438/257, 438/694
See application file for complete search history.

(56) References Cited

U.S. PATENT DOCUMENTS 7,432,158 B1 10/2008 Rao et al.
7,445,984 B2 11/2008 Rao et al.

OTHER PUBLICATIONS

R. A. Puglisi et al., Effects of partial self-ordering of Si dots formed by chemical vapor deposition on the threshold voltage window distribution of Si nanocrystal memories, Journal of Applied Physics, Oct. 23, 2006, pp. 086104-1 to 086104-3, vol. 100, American Institute of Physics.

*Primary Examiner*—Evan Pert
(74) *Attorney, Agent, or Firm*—Horizon IP Pte Ltd

(57) ABSTRACT

A method for forming a semiconductor device is presented. The method includes providing a substrate prepared with first and second regions with a first device layer. A second device layer including nanocrystals is also formed. A cover layer is provided over the second device layer. The cover layer is patterned to expose portions of the second device layer in the first and second regions. The exposed portions of the second device layer in the first and second regions are processed to form modified portions. The processing of the exposed portions at least reduces the nanocrystals to a diameter below a threshold diameter in the modified portions. The modified portions are removed.

20 Claims, 23 Drawing Sheets

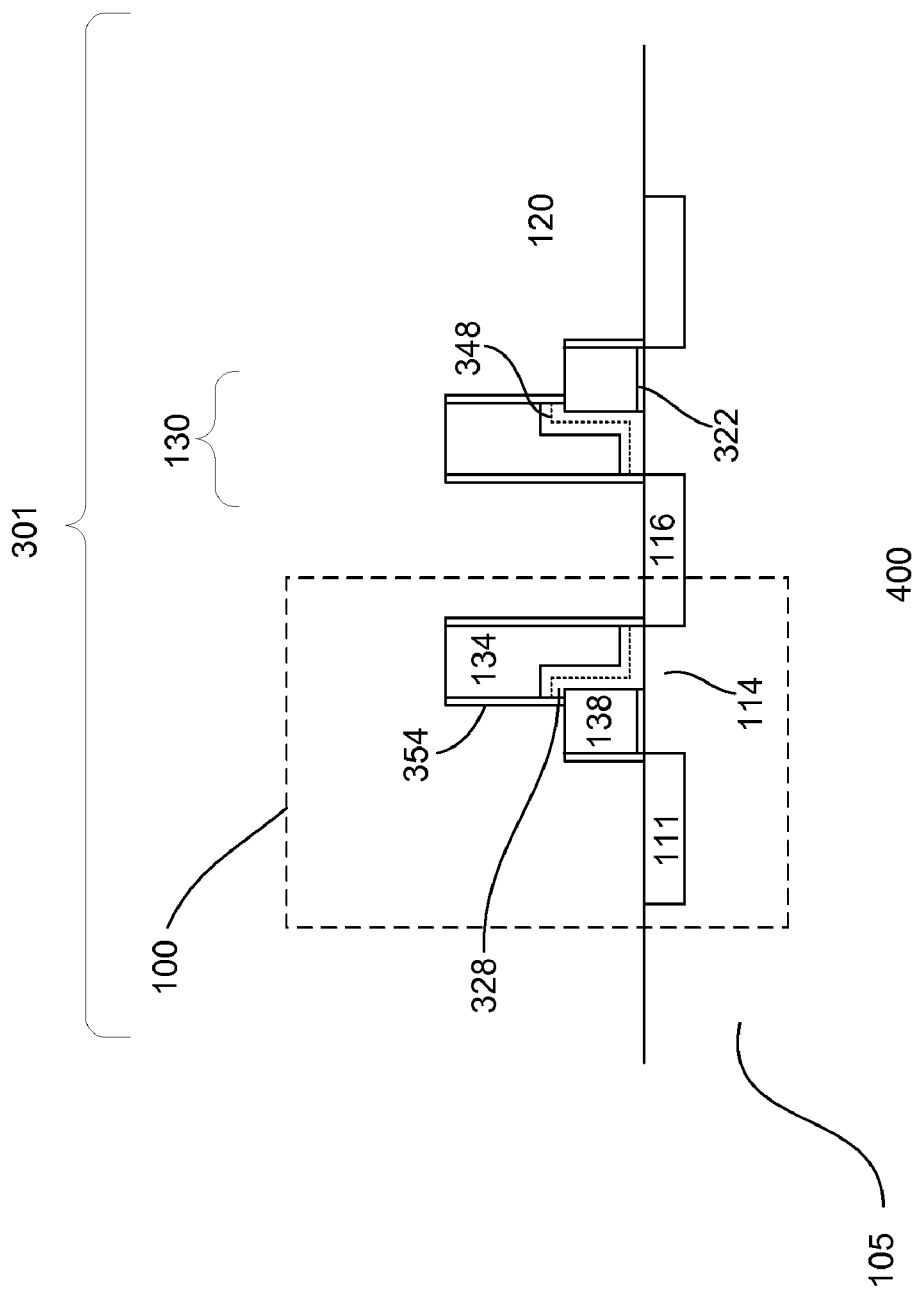

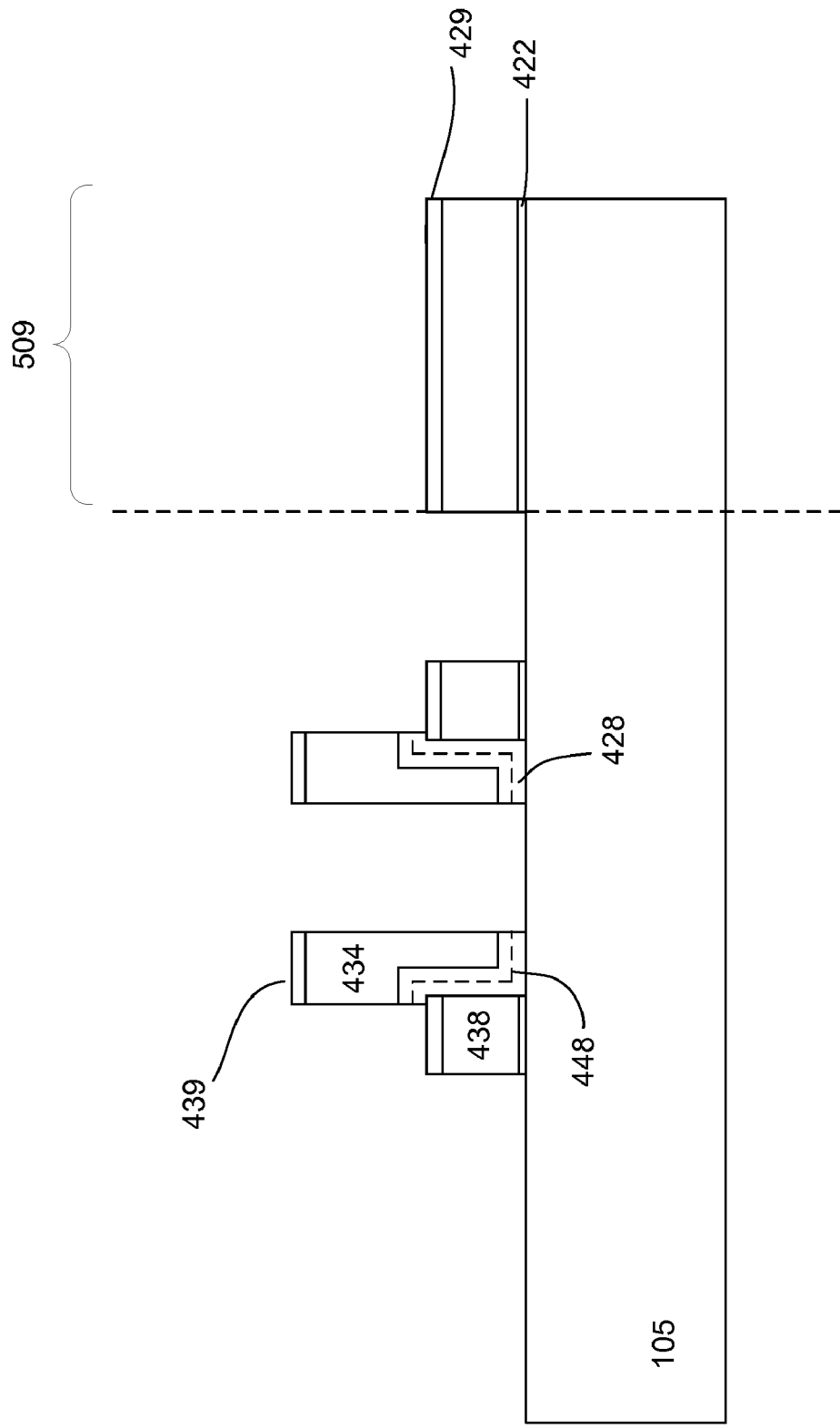

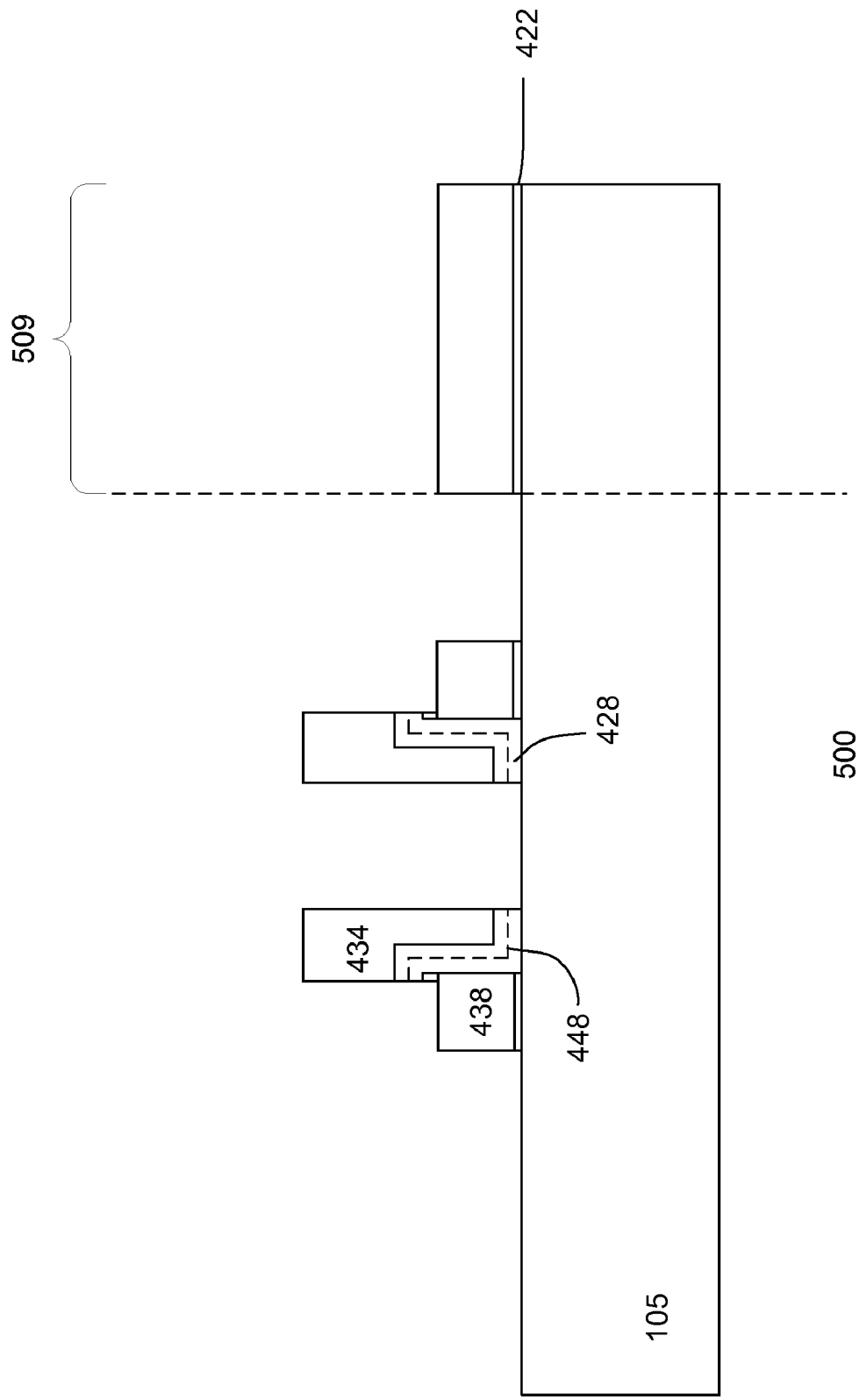

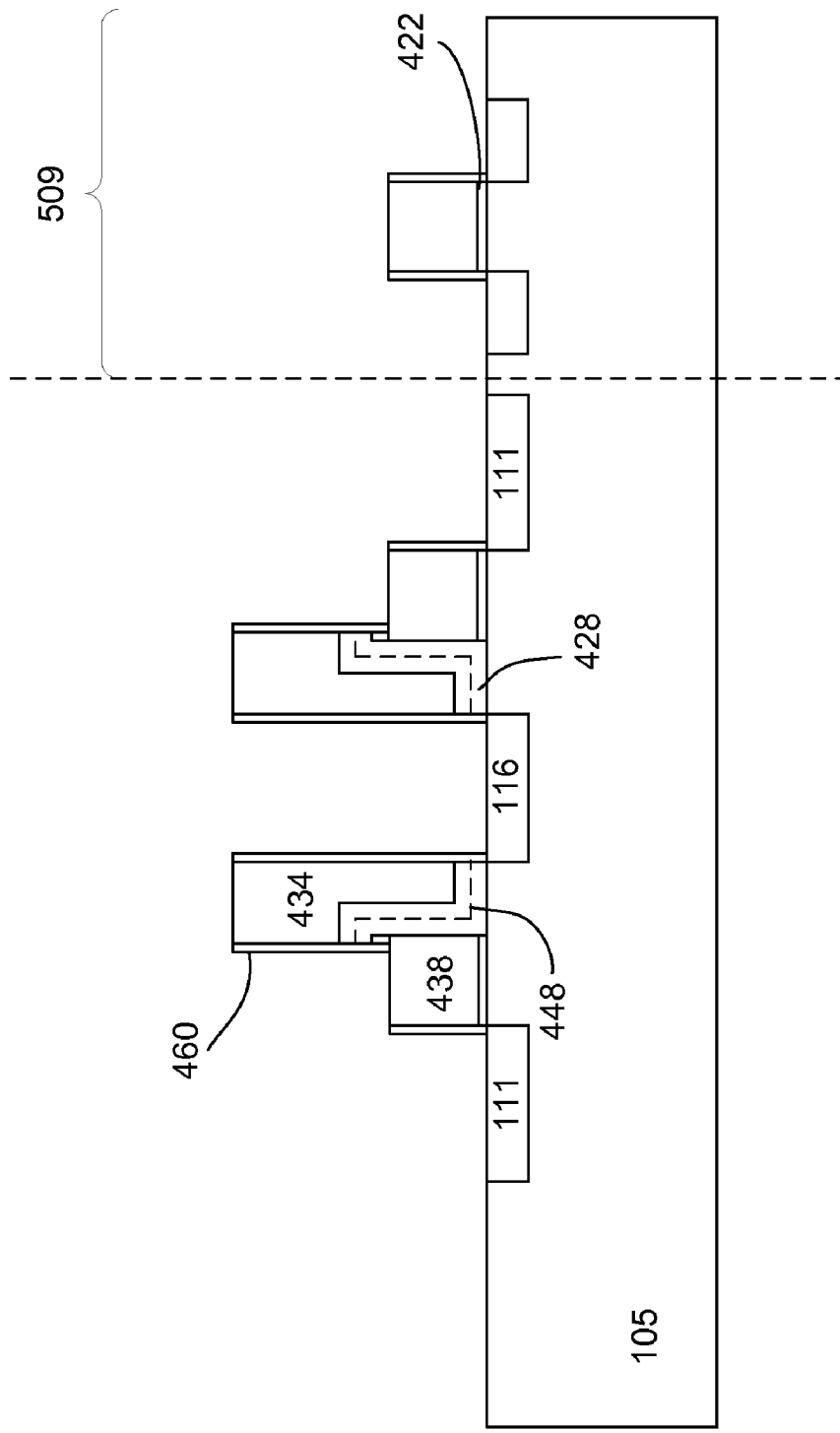

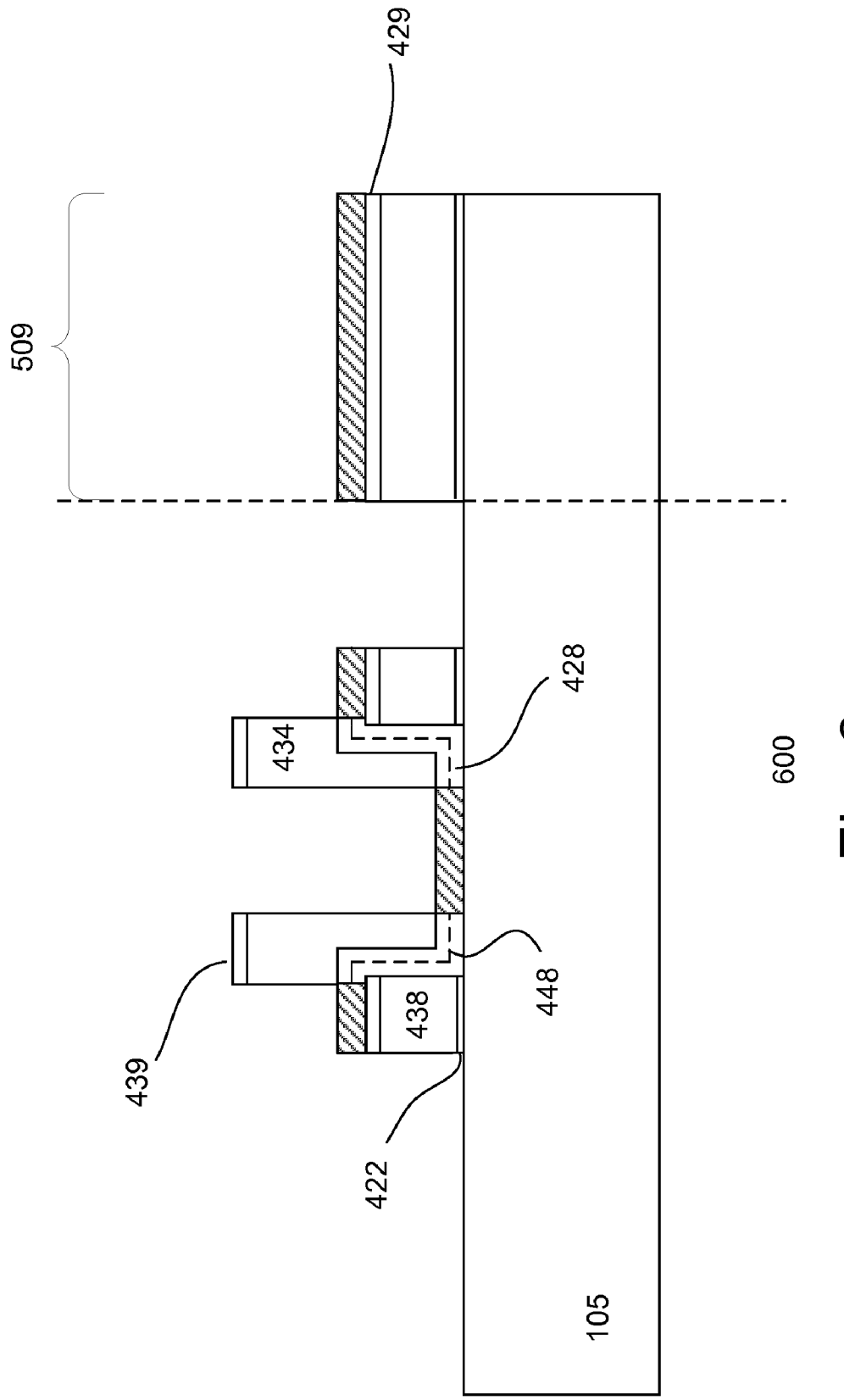

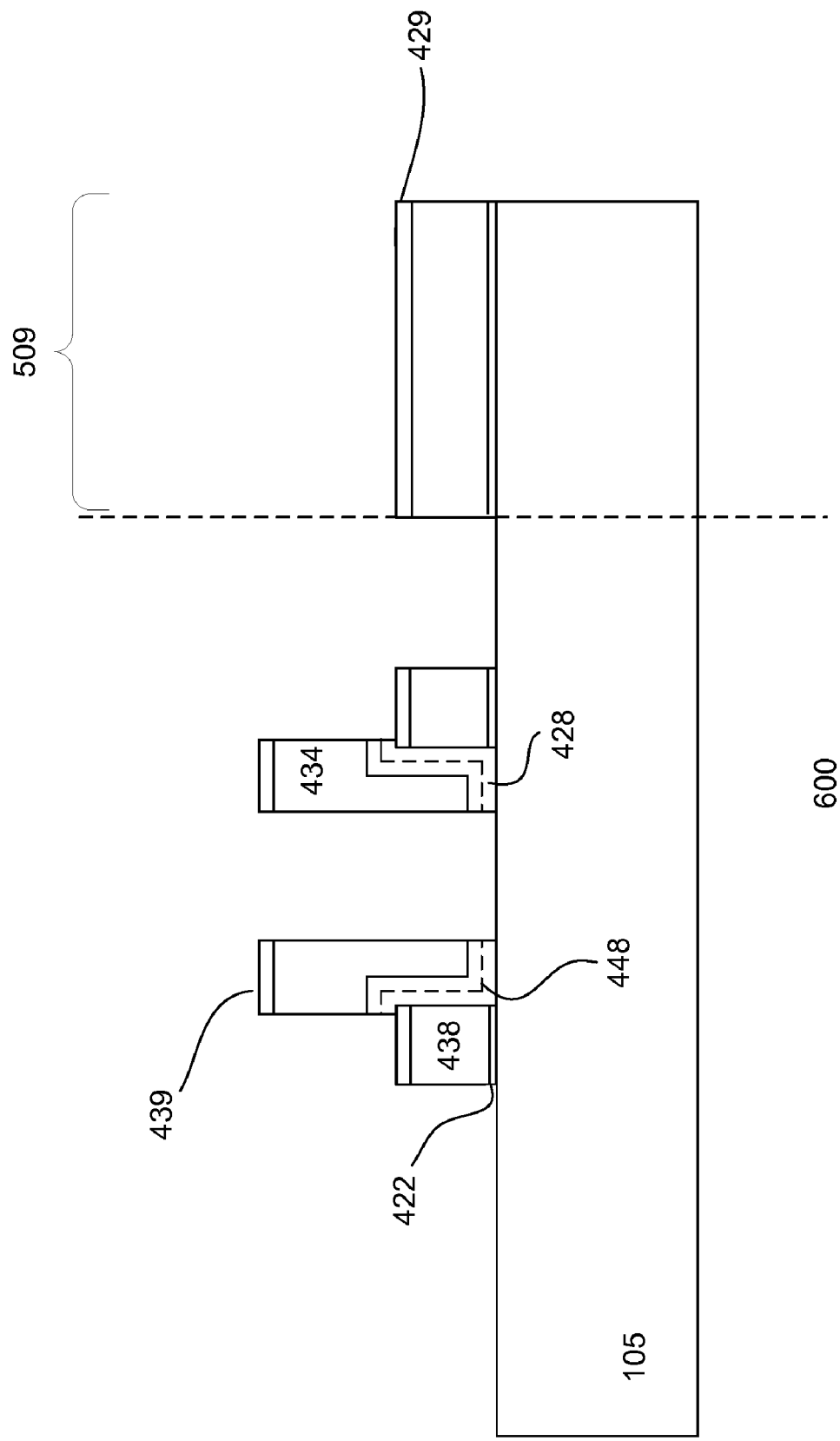

PATTERNING NANOCRYSTAL LAYERS

BACKGROUND

Nanocrystal device layers, such as silicon nanocrystals or germanium nanocrystals are used in semiconductor processing. For example, nanocrystal device layers have been widely used in Non-volatile memory (NVM) devices. NVM devices have achieved widespread adoptions for code and data storage applications. The use of nanocrystal device layers as the storage medium has demonstrated fast injection programming, fast tunnel erase into the gate, and robust data retention.

In the fabrication of devices, the nanocrystal layer is patterned. Patterning selectively removes portions of the nanocrystal layer in order to obtain the desired structure. However, conventional patterning processes have been ineffective in completely removing desired portions of the nanocrystal layer. This leaves nanocrystal remnants on other device layers or substrate. Such nanocrystal remnants create problems for subsequent processes. For example, nanocrystal remnants on the substrate or on device layer hinder uniformity of ion implantation for doping poly gates or substrate to form source/drain regions of transistors. This may undesirably result in high n+/p+ unsilicide poly resistance, high bitcell contact resistance, as well as large resistance variation across the wafer.

SUMMARY

A method for forming a semiconductor device is presented. The method includes providing a substrate prepared with first and second regions with a first device layer. A second device layer including nanocrystals is also formed. A cover layer is provided over the second device layer. The cover layer is patterned to expose portions of the second device layer in the first and second regions. The exposed portions of the second device layer in the first and second regions are processed to form modified portions. The processing of the exposed portions at least reduces the nanocrystals to a diameter below a threshold diameter in the modified portions. The modified portions are removed.

In another embodiment, a method for forming a device is disclosed. The method includes providing a substrate and forming a nanocrystal device layer on the substrate. The nanocrystal device layer is processed to form a processed nanocrystal device layer. The nanocrystals are converted to a dielectric material during the process. The processed nanocrystal device layer is removed using a wet etch.

A device is presented in one embodiment. The device includes a substrate. A substrate has a device structure in a device structure area. The device structure includes a patterned nanocrystal device layer in the device structure area. The device also includes a non-device structure region. The patterned nanocrystal device layer in the non-device structure region is removed with no nanocrystal remnants.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4 shows a cross-sectional view of an embodiment of a memory cell;

FIGS. 5a-m show an embodiment of a process for forming a memory cell; and

FIGS. 6a-d show another embodiment of a process for forming a memory cell.

DETAILED DESCRIPTION

Embodiments generally relate to semiconductor processing and fabricating semiconductor devices. Some embodiments relate to memory devices, such as non-volatile memory devices. Such memory devices, for example, can be incorporated into standalone memory devices, such as USB or other types of portable storage units, or ICs, such as microcontrollers or system on chips (SoCs). Processing of other types of devices are also useful. The devices or ICs can be incorporated into or used with, for example, consumer electronic products, such as computers, cell phones, and personal digital assistants (PDAs).

Figure 1A:
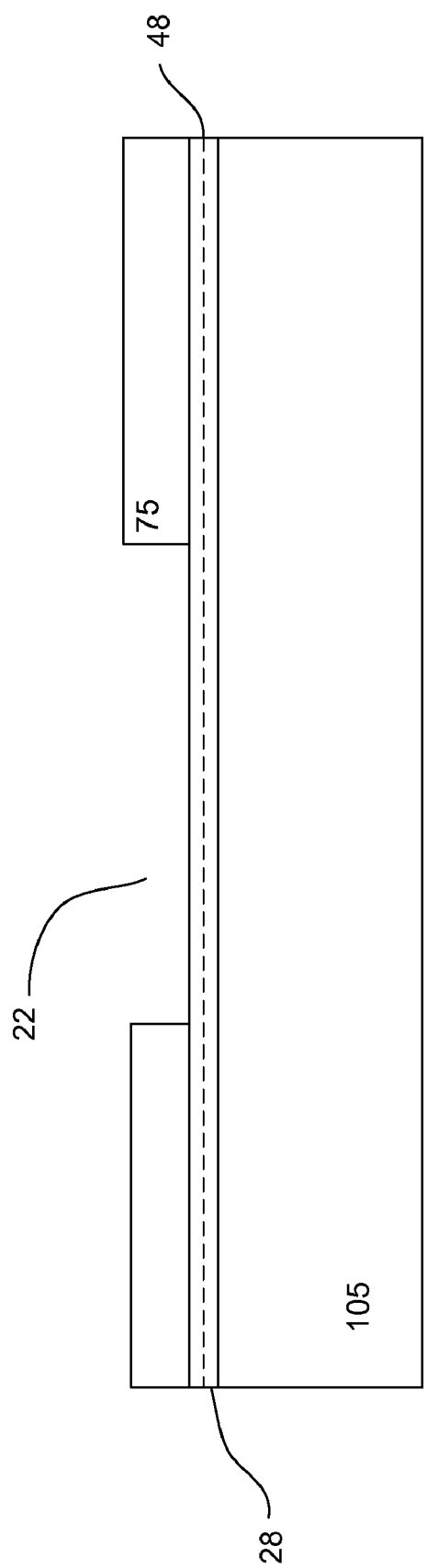
FIGS. 1a-c show a process for patterning nanocrystal materials.
Figure 1B:
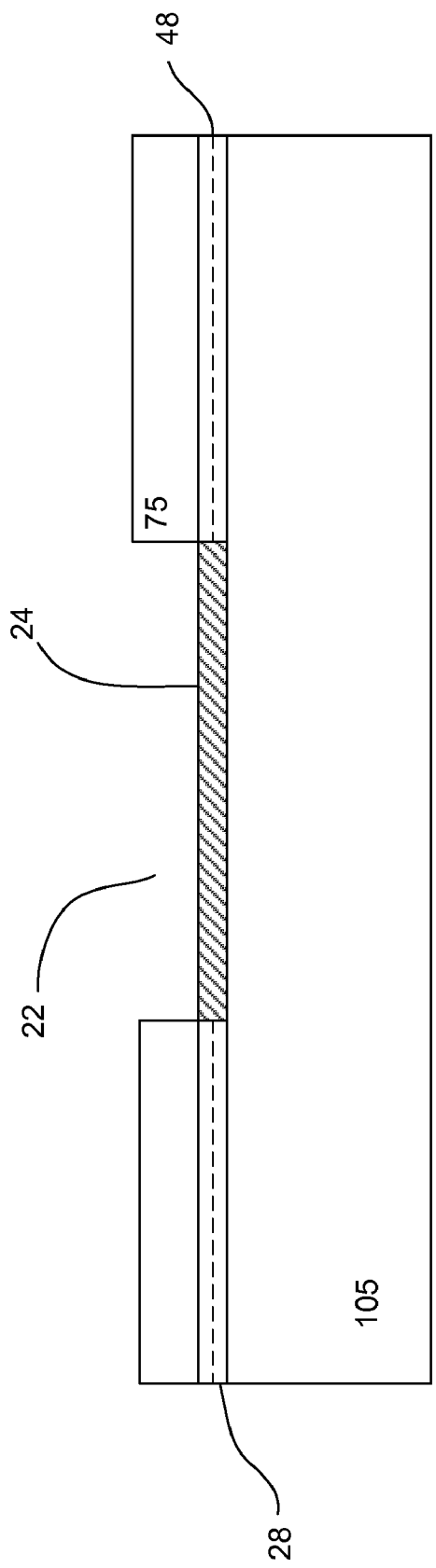
Figure 1C:
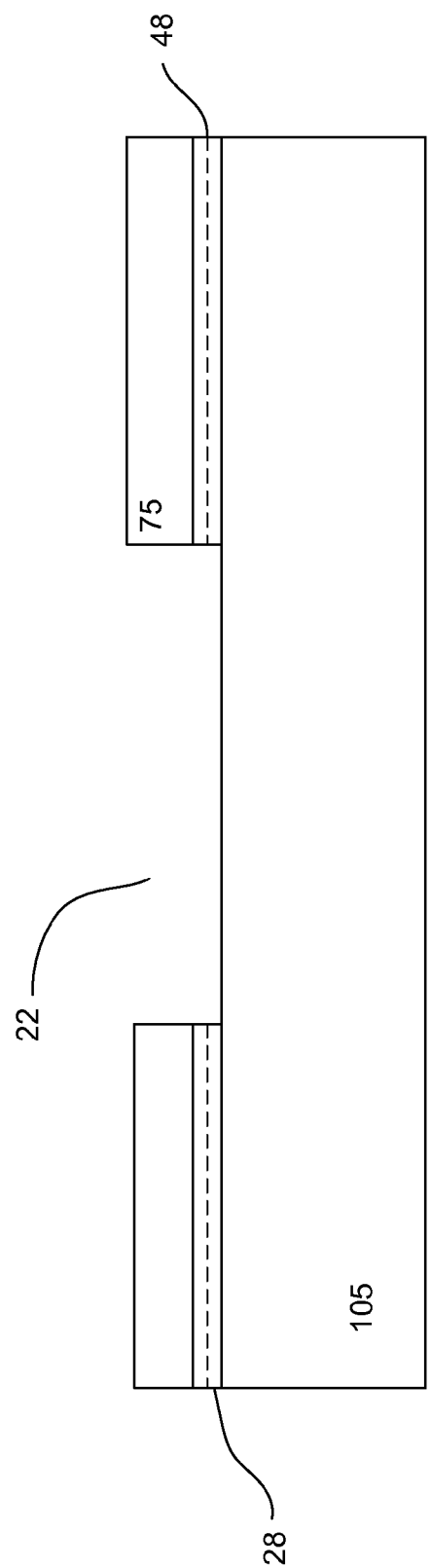

FIGS. 1a-c show an embodiment of a process for forming a device, such as a semiconductor device. Forming other types of devices is also useful. As shown, a substrate 105 is provided. The substrate, for example, comprises a semiconductor substrate, such as silicon. The substrate can be lightly doped with p-type dopants. Other types of substrates, such as silicon germanium, silicon-on-insulator (SOI) or n-type doped substrates, are also useful.

In one embodiment, a device layer 28 comprising nanocrystals 48 is provided over the substrate. The device layer, for example, comprises a dielectric layer with nanocrystals. In one embodiment, the device layer comprises silicon oxide with silicon nanocrystals. Providing device layers with other types of dielectric material or nanocrystals is also useful. For example, the device layer can comprise germanium nanocrystals. The device layer can be about 230-600 Å thick with the diameter of the nanocrystals being from about a few nm to about 40 nm. Providing a device layer with other thicknesses or diameters of nanocrystals is also useful.

Various techniques can be used to form the device layer with nanocrystals. For example, a bottom silicon oxide is first provided on the substrate. The silicon oxide can be formed by thermal oxidation, such as wet or dry oxidation. A silicon layer, such as polysilicon is formed on the bottom oxide. The silicon layer is processed by an anneal to form nanocyrstals. A cap or top oxide layer can be formed over the nanocrystals. The cap oxide, for example, can be a high temperature oxide (HTO). In one embodiment, a nitrided shell may be provided to surround the nanocrystals prior to cap or top oxide layer deposition. Other techniques for forming the nanocrystal layers are also useful. Such techniques, for example, are described in Baron et al., "Chemical vapor deposition of Ge nanocrystals on $SiO_2$", Applied Physics Letters 83, p. 1444-1446, 2003, which is herein incorporated by reference for all purposes.

As shown, the device layer is formed on the substrate. It is understood that the substrate may include device layer or layers which may be patterned and contain an uneven topography.

Above the device layer is another device layer 75, referred to as a covering layer. The covering layer can be various types of device layer. The covering layer can comprise, for example, polysilicon. Other types may also be used for the covering layer. For example, the covering layer may comprise dielectric or conductive materials. In other embodiments, the covering layer may comprise a covering stack having a plurality of layers. For example, the covering stack may include polysilicon with an anti-reflective coating (ARC) over it. Other types of covering stacks may also be useful. The covering layer contains a pattern which selectively exposes a portion or portions 22 of the nanocrystal device layer in an opening 22.

Referring to FIG. 1b, the substrate is subjected to processing to modify the exposed portion of the device layer to form a modified portion or portions 24 of the device layer. The unexposed portion or portions are unmodified portion or portions. In one embodiment, processing comprises oxidizing the exposed portion or portions of the nanocrystal device layer to at least reduce the size of the nanocrystals. Other types of processing to reduce the size of the nanocrystals may also be useful. Preferably, the processing at least reduces the size of the nanocrystals to a size below a threshold diameter to enable their removal without remnants. For example, the threshold diameter is about 15 nm. Other threshold diameters are also useful. In other embodiments, the exposed portion of the device layer is oxidized, consuming the nanocrystals. For example, the exposed portion is oxidized to form an oxide layer.

The processing, in one embodiment, comprises an oxidizing ambient, such as oxygen containing ambient. For example, the oxygen containing ambient can be oxygen ($O_2$) or ozone ($O_3$). In one embodiment, the processing comprises an ozone clean. The ozone clean can be performed at a temperature of about 400° C. Processing the device layer using other ambients or temperatures is also useful.

As shown, in FIG. 1c, the process continues. The process continues by selectively removing the modified portion of the device layer in the opening to expose the surface of the substrate. In one embodiment, the modified portion of the nanocrystal device layer can easily be selectively removed by a wet etch without any nanocrystal remnants. In one embodiment, the modified portion can easily be selectively removed with diluted hydrofluoric acid (DHF) and standard clean 1 (SC1) with megasonic. The wet etch, for example, can be performed at about 40-60° C. for about 10-30 minutes. Megasonic serves to increase the wet etch efficiency by removing any remaining nanocrystal residue or un-oxidized nanocrystal core. Other processes or wet etch process parameters may also be useful.

As described, the modified portion of the device layer in the opening is completely removed, avoiding any nanocrystal remnants. The ability to completely remove nanocrystals enables the use of larger nanocrystals and improves subsequent processing. This can result in an expanded operating window (e.g., faster programming speed) and improved subsequent processing, which enhances reliability and yields.

In one embodiment, the process is employed in forming non-volatile memory cells with a nanocrystal storage layer. For example, the process is employed in forming a split gate non-volatile memory cell. Forming other types of non-volatile memory cells or devices is also useful.

Figure 2:
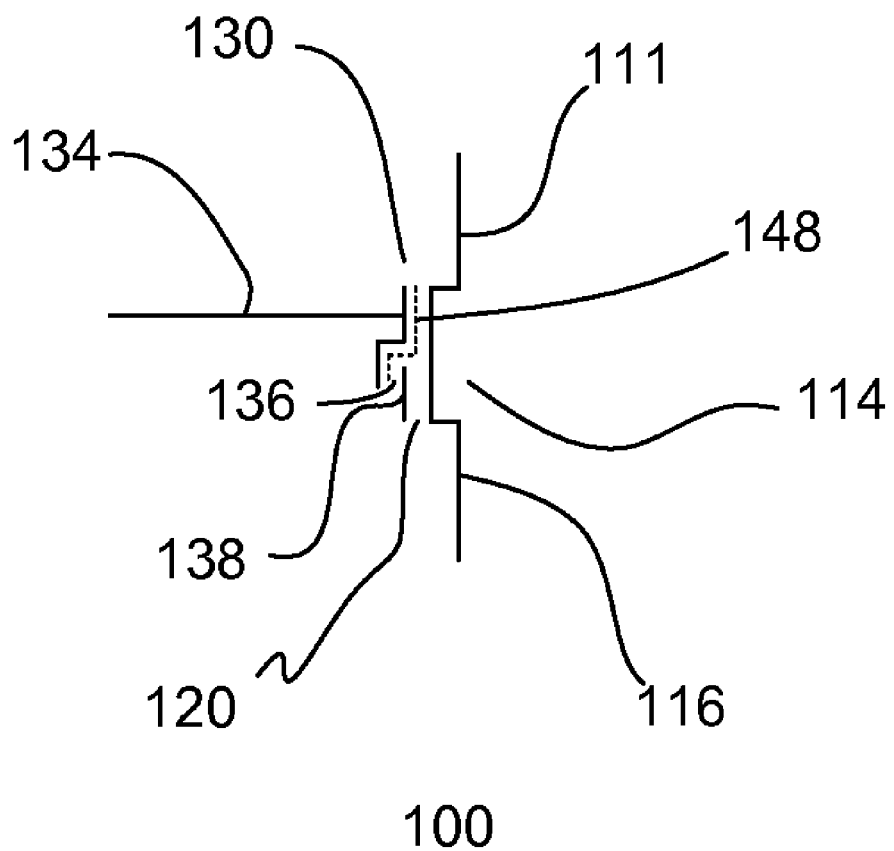
FIG. 2 shows an embodiment of a memory cell.

FIG. 2 shows a schematic diagram of an embodiment of a memory cell 100. The memory cell, in one embodiment, comprises a non-volatile memory cell. The memory cell comprises a transistor with a gate 130 over a channel 114 and between first and second terminals 111 and 116. The gate comprises a split gate having a first gate 134 and a second gate 138. In one embodiment, the first gate comprises a control gate, the first terminal comprises a source terminal, the second gate comprises a select gate and the second terminal comprises a drain terminal. Other configurations of terminals are also useful. For example, the first terminal can be a drain terminal, the second terminal can be a source terminal.

In one embodiment, the first gate is adjacent to and partially overlaps the second gate. For example, the control gate is adjacent to and partially overlaps the select gate. In one embodiment, a portion of the control gate is disposed over the channel region and partially overlaps the select gate in an overlap region 136. A dielectric layer or layers 120 isolate the gates from each other and the channel.

In one embodiment, the dielectric layer isolating the gates comprises nanocrystals. For example, the nanocrystal dielectric layer can comprise silicon oxide with germanium nanocrystals. Other types of dielectric materials and/or nanocrystals are also useful. In one embodiment, portions of the nanocrystal dielectric layer which are to be patterned or removed are first oxidized prior to removal.

The control gate is coupled to a control gate voltage source ($V_{cg}$), the select gate is coupled to a select gate voltage source ($V_{sg}$), the source terminal is coupled to a source voltage source ($V_s$), and the drain is coupled to a drain voltage source ($V_d$). For example, $V_{cg}$ can be about 0-15 V or about 8-9.5V, $V_{sg}$ can be about 0-3V or about 0.6-1.5 V, $V_d$ can be about 0-3V or about 0-3V and $V_s$ can be about 0-3 V or about 0-6 V. Other voltage values can be supplied to the memory cell, for example, depending on the technology. The appropriate voltages are supplied to the memory cell to access the memory cell, such as programming and reading.

Figure 3:
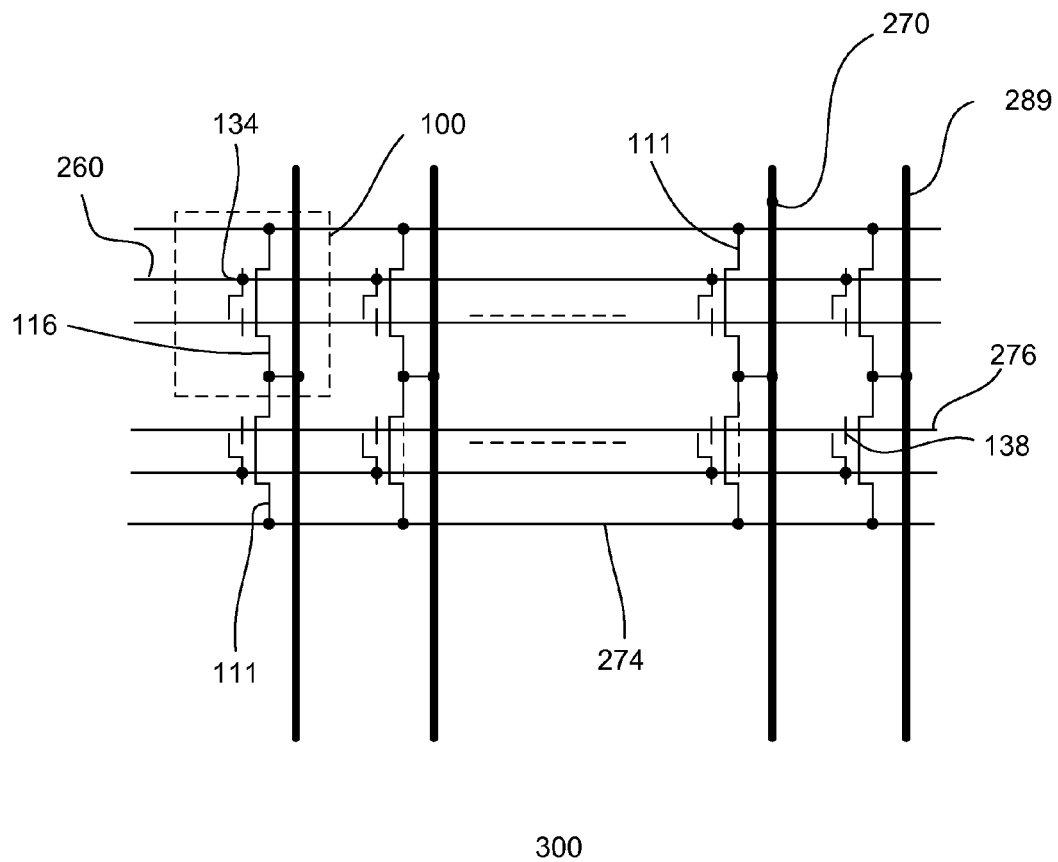
FIG. 3 shows an embodiment of a memory array.

FIG. 3 shows an embodiment of a memory array 300. In one embodiment, the memory array comprises a non-volatile memory array. The memory array comprises a plurality of memory cells arranged in rows and columns. The memory cells, for example, comprise memory cells 100 as described in FIG. 2. A row corresponds to, for example, a wordline (WL) 260 and a column corresponds to a bitline (BL) 289 of the array. In one embodiment, the BLs are coupled to the second or drain terminals 116 while WLs are coupled to the first or control gates 134 of the memory cells. For example, WLs provide $V_{cg}$, BLs provide $V_d$. Source lines (SLs) 274 may be employed to provide $V_s$ to the first or source terminals 111; select gate lines or SGLs 276 may be used to provide $V_{sg}$ to the second or select gates 138 of the memory cells. SLs and SGLs maybe coupled to the memory cells as desired. The memory cells may be configured in a NOR type array architecture. Arranging the memory cells in other types of array architectures, such as NAND, is also useful.

FIG. 4 shows a portion 400 of an embodiment of a device or IC. As shown, the portion includes a substrate 105. The substrate, for example, comprises a silicon substrate. The substrate can be lightly doped with p-type dopants. Other types of substrates, such as silicon germanium or silicon-on-insulator (SOI), are also useful.

The substrate can be prepared with a region 301 containing memory cells 100. In one embodiment, the memory cells comprise non-volatile memory cells. Other types of memory cells are also useful. The region can be referred to as an array region. The array region shows adjacent memory cells. Although only two memory cells are shown, it is understood that many more memory cells are included in the device. The array region can be arranged to have sub-regions corresponding to, for example, groups of memory cells. The array region comprises heavily doped well or wells (not shown) with dopants of a first polarity type. The first polarity type can be n-type or p-type, depending on the memory cell type. The first polarity type wells are used for second polarity type memory cells. For example, n-type wells are used for p-type memory cells while p-type wells are used for n-type memory cells. P-type dopants can include boron (B), aluminum (Al) or a combination thereof while n-type dopants can include phosphorus (P), arsenic (As), antimony (Sb) or a combination thereof.

Additionally, the substrate may include non-array regions (not shown), such as logic portion for support circuitry. The substrate may also include other regions for other types of circuitry, depending on the type of device or IC. The logic portion, for example, can include low voltage (LV), high voltage (HV) and dual gate oxide (DGO) devices. The DGO devices, for example, are used for I/O circuitries.

The substrate includes isolation regions (not shown) to isolate active device regions from other active device regions, as required. The isolation regions, for example, comprise shallow trench isolation (STI) regions. Other types of isolation regions are also useful.

In one embodiment, a memory cell comprises a transistor with a gate 130 between first and second terminals 111 and 116 formed by, for example diffusion regions. The first terminal, for example, serves as a source and the second terminal serves as a drain. The source and drain comprise, for example, second polarity type dopants.

The gate, in one embodiment, comprises a split gate with first and second gates 134 and 138. For example, the first gate can be a control gate and the second gate can be a select gate. In one embodiment, the first gate is adjacent to and overlaps the second gate in an overlap region. In one embodiment, the first gate is adjacent to and overlaps a portion of the second gate in the overlap region, leaving a portion of the second gate uncovered by the first gate in a non-overlap region. The adjacent portion of the first gate is over the first gate region of the substrate.

The gates are isolated from each other and the substrate by a dielectric layer. In one embodiment, the dielectric layer comprises a plurality of dielectric layers. For example, the dielectric layer comprises a second gate dielectric layer 322 and an inter-gate dielectric layer 328 provided to separate the first gate from the second gate and substrate. The second gate dielectric layer, for example, is a LV gate dielectric layer. Other types of second gate dielectric layers may also be employed. Dielectric sidewall spacers 354 can be provided on sidewalls of the gates. The dielectric sidewall spacers, for example, comprise silicon oxide. Other types of dielectric material can also be used to form the spacers.

In one embodiment, the inter-gate dielectric layer comprises nanocrystals 348. The inter-gate dielectric layer, for example, comprises oxide with silicon nanocrystals. Other types of inter-gate dielectric layers are also useful. For example, the inter-gate dielectric layer can comprise a high-K dielectric material and/or other types of nanocrystals, such as germanium nanocrystals. The nanocrystals may include a nitrided layer surrounding the nanocrystals.

In one embodiment, portions of the inter-gate dielectric layer with nanocrystals which are patterned or removed are first selectively processed prior to removal to form modified portions. The processing, in one embodiment, comprises selectively oxidizing the portions of the inter-gate dielectric layer which are removed. By selectively processing the nanocrystal layer to form modified portions, we have discovered that the modified portions can easily be removed using a wet etch without crystal remnants. In one embodiment, the oxidized nanocrystal layer can be easily selectively and completely removed with a megasonic process using DHF and SC1. The ability to completely remove nanocrystals improves subsequent processing. For example, this can result in improved process window, reliability and yields.

For example, improving uniformity in source and drain implant of the memory cell can be achieved. This results in more uniform sheet resistance between source and drain. Other advantages may, for example, include more complete salicidation of contact regions, more uniform gate electrode implant to result in greater uniformity in unsilicided gate resistance across the wafe, less peripheral circuit reference current variability due to tighter control of gate resistance as well as enabling higher coverage or use of larger nanocrystals which contributes to a larger program window and faster program speed.

The first gate, for example, may be a gate conductor which serves as a common gate for a row of memory cells. Adjacent memory cells can be configured as mirror gate electrodes which may share a common diffusion region. Other configurations or layouts of memory cells are also useful. The gates may also be provided with salicide contacts (not shown).

Figure 5A:
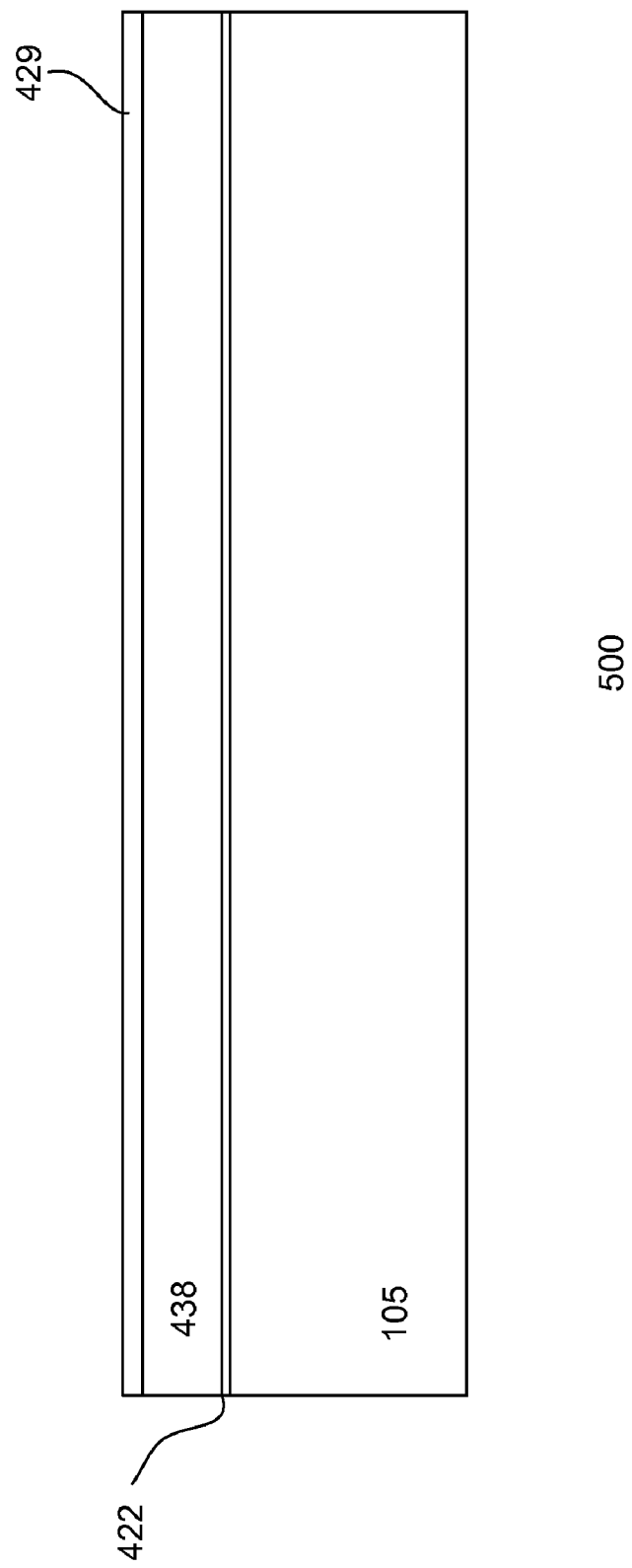

FIGS. 5*a*-*m* show cross-sectional views of an embodiment of a process for forming a device or IC 500. Referring to FIG. 5*a*, a substrate 105 is provided. The substrate can comprise a silicon substrate, such as a lightly p-type doped substrate. Other types of substrates, including silicon germanium or silicon-on-insulator (SOI), are also useful.

The substrate is prepared with an array region containing memory cells. In one embodiment, the memory cells comprise non-volatile memory cells. Other types of memory cells are also useful. The array region comprises heavily doped well or wells (not shown) with dopants of a first polarity type. The first polarity type can be n-type or p-type, depending on the memory cell type. The first polarity type wells are used for second polarity type memory cells. For example, n-type wells are used for p-type memory cells while p-type wells are used for n-type memory cells. P-type dopants can include boron (B), aluminum (Al) or a combination thereof while n-type dopants can include phosphorus (P), arsenic (As), antimony (Sb) or a combination thereof.

Additionally, the substrate may include a logic portion (not shown) for support circuitry. The substrate may also include regions for other types of circuitry, depending on the type of device or IC.

Generally, the IC includes regions with both first and second type wells (not shown). To form the doped wells, ion implantation techniques, such as implantation with a mask, can be used. The first and second type wells can be formed in separate processes. Other techniques for forming the active regions are also useful.

The substrate can be prepared with isolation regions (not shown), for example, to separate the active regions from each other and other active device regions. In one embodiment, the isolation regions comprise shallow trench isolations (STIs). Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of the doped wells. Other processes or materials can also be used to form the STIs.

In one embodiment, various layers of the second gate are formed on the substrate. The second gate, for example, serves as the select gate. In one embodiment, a second gate dielectric layer 422 is formed on the substrate. The gate dielectric layer, in one embodiment, comprises silicon oxide. Other types of gate dielectric layers, such as silicon oxynitride, may also be used. Various techniques can be employed to form the gate dielectric layer. For example, the gate dielectric layer can be formed by thermal oxidation in either a wet or dry ambient. The oxidation can be performed at a temperature range of about 750-1100° C. with a pressure range of about 0-760 T. In an alternative embodiment, the oxidizing ambient can be provided with nitrogen. The thickness of the second gate dielectric layer is about 15 to 100 Å. The second gate dielectric layer can be formed using other types of dielectric materials, thicknesses or techniques.

A second gate electrode layer 438 is deposited on the second gate dielectric layer. The gate electrode layer comprises, in one embodiment, polysilicon. The gate electrode layer can be formed as an amorphous or non-amorphous layer. Alternatively, other types of gate electrodes can be used. The thickness of the second gate electrode layer, for example, is about 400-2000 Å. Other thicknesses are also useful. To form the second gate electrode layer, techniques, such as chemical vapor deposition (CVD), can be used. Other techniques are also useful.

In one embodiment, the second gate electrode layer comprises a doped gate electrode layer. For example, the second gate electrode layer comprises n-type dopants having a concentration of about 1-9E15 ion/cm$^2$. Other types of dopants and concentrations are also useful. The dopants, for example, are incorporated into the gate electrode layer by ion implantation. Other techniques, such as insitu-doping, can also be used for incorporating the dopants. Providing undoped gate electrode layers may also be useful.

Figure 5B:
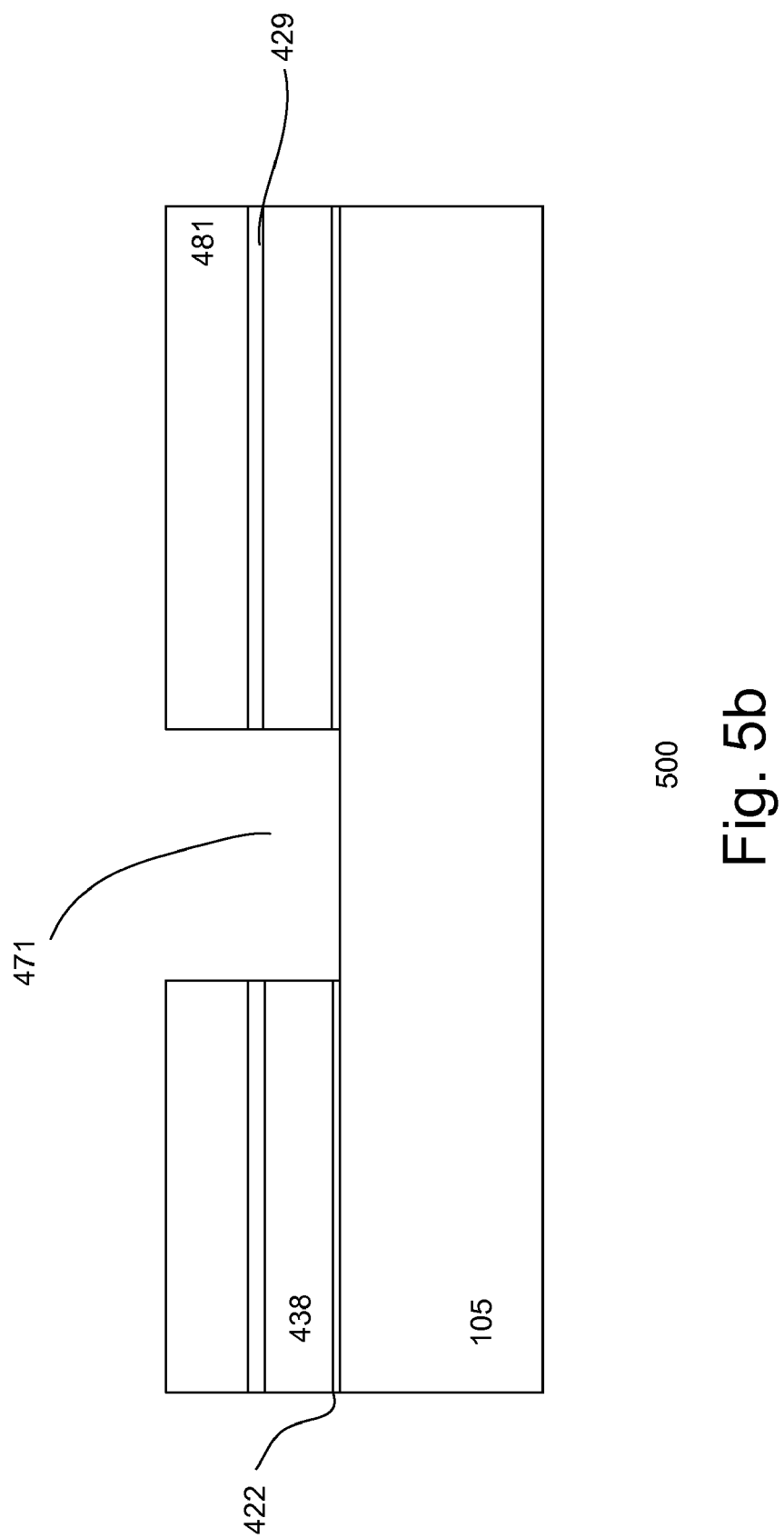

Referring to FIG. 5b, the various second gate layers are patterned. In one embodiment, the various layers are patterned to form gate stacks. Techniques, such as mask and etch, can be used to form the gate stack. For example, a photoresist layer 481 is formed over the gate layers and patterned, exposing portions of the gate layers. An anisotropic etch, such as a reactive ion etch (RIE), is performed to remove exposed portions 471 of the gate layers.

In one embodiment, an ARC layer 429 is formed on top of the second gate electrode layer below the photoresist layer 481. The ARC layer improves lithographic resolution and gate etch profile, it also enhances the isolation between the select gate and control gate. The ARC layer, for example, comprises silicon nitride. Other types of ARC layers are also useful. The thickness of the ARC layer is, for example, about 10-500 Å. After patterning, the photoresist layer is removed, leaving the ARC layer over the gate stack.

Figure 5C:
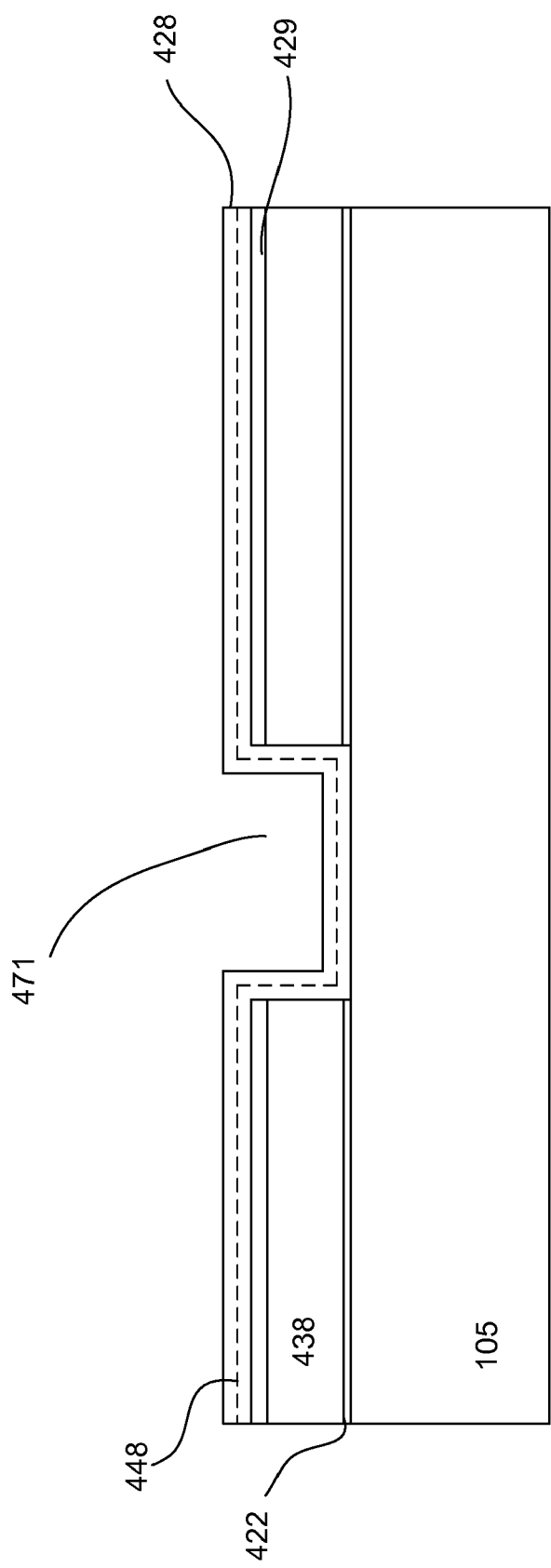

As shown in FIG. 5c, an inter-gate dielectric layer 428 is formed. The inter-gate dielectric layers line the gate stacks, sidewalls, and substrate surface. Forming the inter-gate dielectric layer, in one embodiment, comprises forming multiple layers wherein at least one of the layers includes nanocrystals.

In one embodiment, the inter-gate dielectric layer comprises an inter-gate dielectric stack having multiple sub-layers which includes a nanocrystal sub-layer. The inter-gate dielectric stack, in one embodiment, comprises three layers. The first layer is, for example, a thermally grown bottom oxide with a thickness of about 50-100 Å. The bottom oxide can be formed by either wet or dry oxidation. The second layer is a layer of nanocrystals deposited on top of the first layer by, for example, CVD and anneal. The second layer can comprise a polysilicon or amorphous silicon layer which is processed by an anneal to form nanocrystals. The size range of the nanocrystals can be about 30-400 Å. A nitrided layer can be provided to surround the nanocrystals. The third layer is an oxide layer formed to cap the nanocrystals by, for example, CVD or rapid thermal CVD (RTCVD). The thickness of the third layer is about 100-250 Å. In one embodiment, the cap layer comprises a HTO layer. In one embodiment, a nitrided shell may be provided to surround the nanocrystals prior to cap or top oxide layer deposition. Providing other configurations of the dielectric stack may also be useful. For example, other materials, thicknesses or deposition techniques can be used.

Figure 5D:
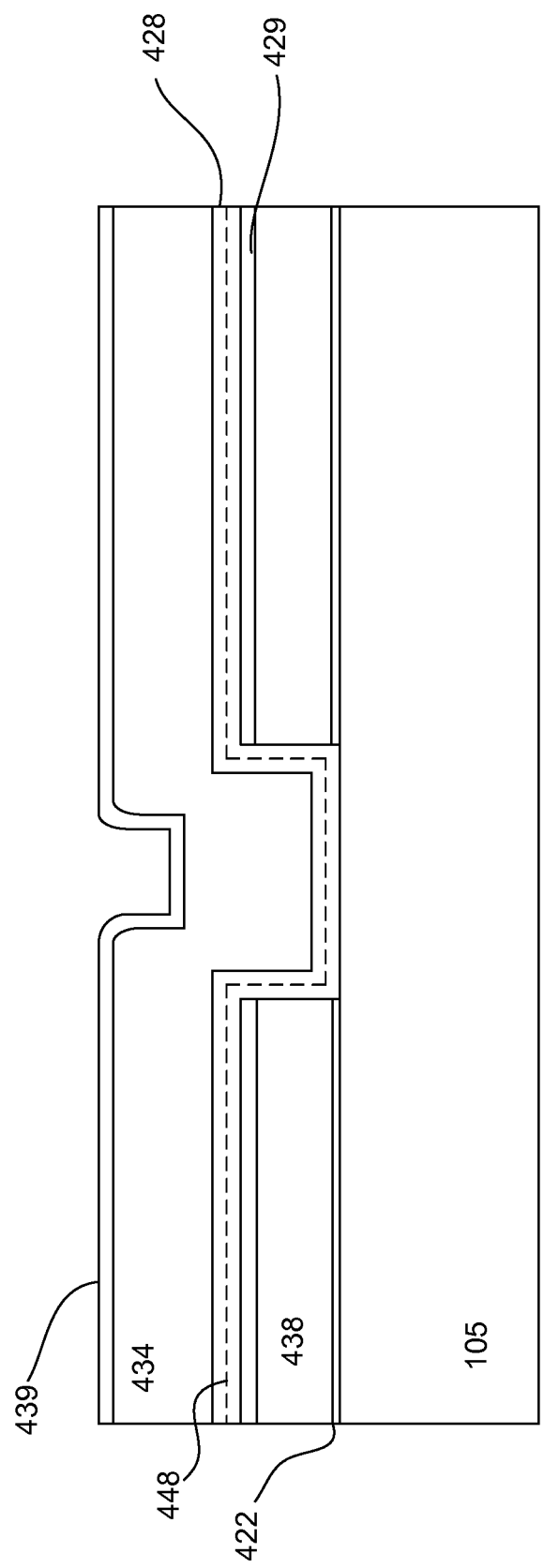

In FIG. 5d, a first gate electrode layer 434 is deposited on the substrate. The first gate electrode layer, in one embodiment, comprises a conformal layer of polysilicon. The gate electrode layer can be formed as an amorphous or non-amorphous layer. The gate electrode layer, in one embodiment, comprises a doped gate electrode layer. For example, the gate electrode layer can be doped with n-type dopants, such as phosphorus, at a concentration of about 1-9E15 ions/cm$^2$. The dopants can be incorporated by ion implantation. Other techniques for incorporating the dopants can also be employed. Forming the gate electrode with other types of gate electrode materials may also be useful.

In one embodiment, the first gate electrode comprises a thickness which is similar to that of the second gate. The thickness of the first and second gate electrode layers, for example, is about 400-2000 Å. Other thicknesses or configurations of gate electrode layers may also be useful. For example, the gate electrode layer may have different thicknesses. To form the first gate electrode layer, techniques, such as chemical vapor deposition (CVD), can be used. Other techniques are also useful.

As shown, an ARC layer 439 is formed over the first gate electrode layer. The ARC, for example, comprises silicon nitride or oxide. Other types of ARC layers are also useful. The thickness of the ARC layer is, for example, about 10-500 Å. The ARC layer serves to improve lithographic resolution and gate etch profile.

Figure 5E:
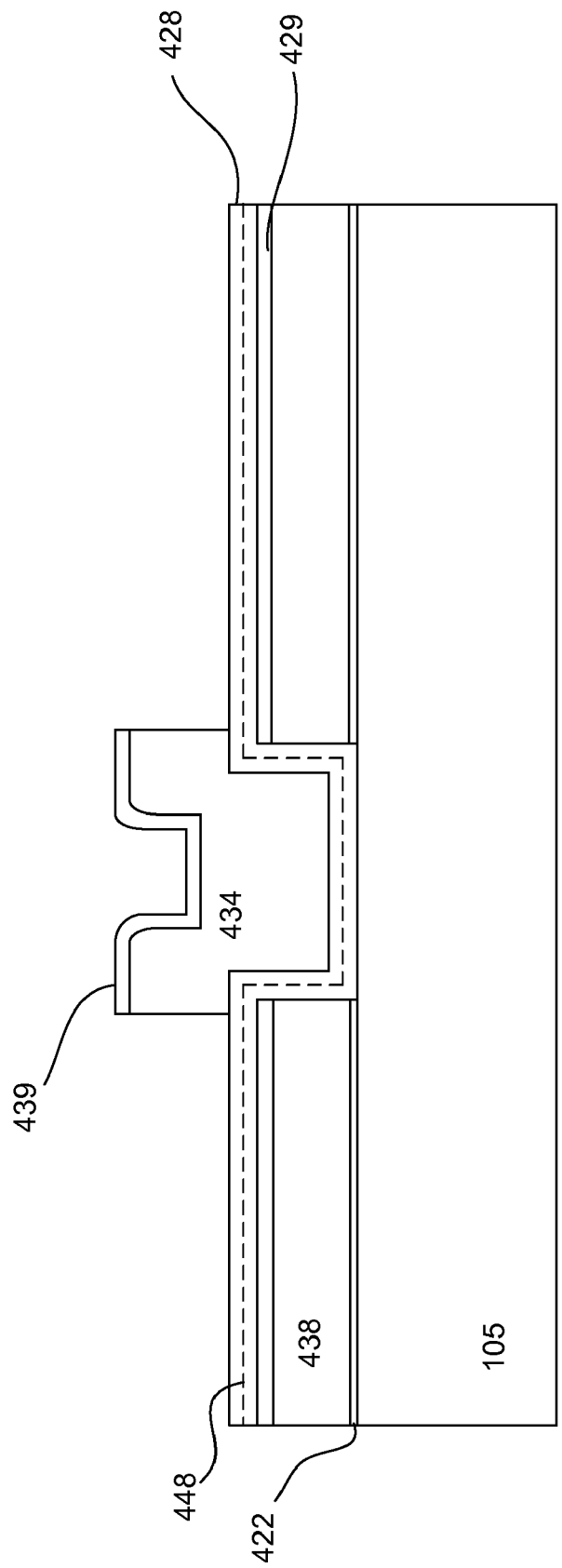

Referring to FIG. 5e, the first gate electrode and ARC layers are patterned to expose portions of the dielectric nanocrystal layer. As shown, the layers are patterned to form first gate electrodes over second gate electrode stack. In one embodiment, the first gate electrode layers are patterned to overlap the second gate electrode stacks. Techniques, such as mask and etch, can be used to pattern the substrate. For example, a photoresist layer is formed over the ARC layer. The photoresist layer can be selectively patterned by lithographic techniques. The pattern of the photoresist can be transferred to the ARC and gate electrode layers by, for example, an anisotropic etch such as RIE. The various layers beneath the photoresist can be patterned to form the memory cells. The photoresist layer is removed after forming the memory cells.

Figure 5F:
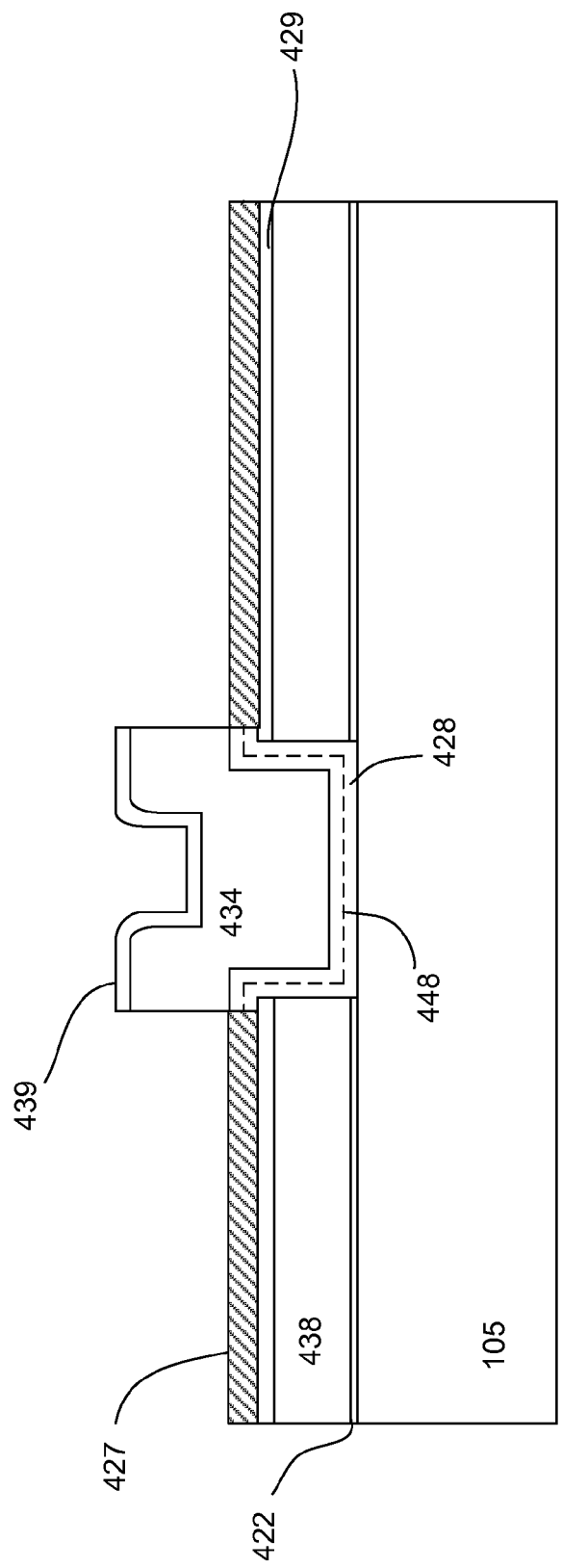

As shown in FIG. 5f, patterning of the first gate electrode exposes portions of the inter-gate dielectric layer with nanocrystals over the second gate electrode unprotected by the first gate electrode. In one embodiment the process continues by exposing the nanocrystals. For example, in the case of an inter-gate dielectric stack, the top oxide sub-layer is removed to expose the nanocrystals.

The substrate is subjected to processing to modify the exposed portions of the nanocrystal layer to form modified portions of the nanocrystal layer. The unexposed portions are unmodified portions. In one embodiment, processing comprises oxidizing the exposed portions of the nanocrystal layer to at least reduce the size of the nanocrystals. Other types of processing to reduce the size of the nanocrystals may also be useful. Preferably, the processing at least reduces the size of the nanocrystals to a size below a threshold diameter to enable their removal without remnants. For example, the threshold diameter is about 15 nm. Other threshold diameters are also useful. In other embodiments, the exposed portion of the nanocrystal layer is oxidized to fully consume the nanocrystals. For example, the exposed portion is oxidized to form an oxide layer.

The processing, in one embodiment, comprises an oxidizing ambient, such as oxygen containing ambient. For example, the oxygen containing ambient can be oxygen ($O_2$) or ozone ($O_3$). In one embodiment, the processing comprises an ozone clean. The ozone clean can be performed at a temperature of about 400° C. to oxidize the nanocrystals. Processing the device layer using other ambients or temperatures is also useful.

Figure 5G:
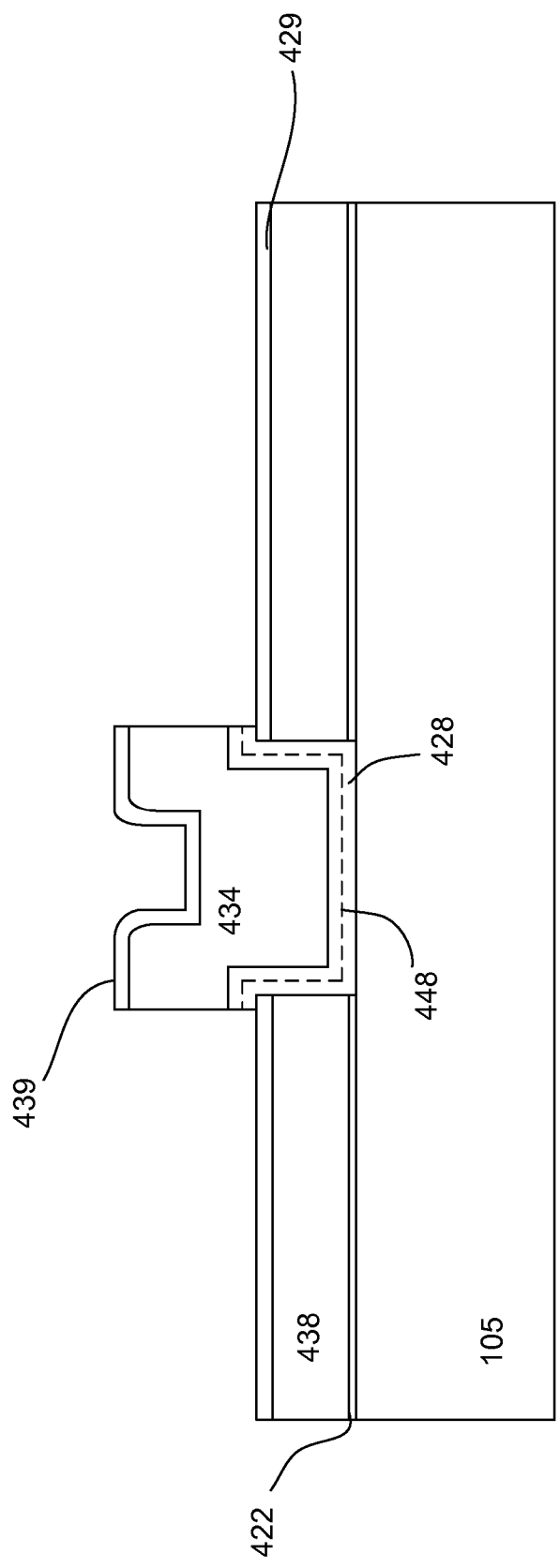

FIG. 5g shows the selective removal of the modified portions of the nanocrystal layer. Removal of the modified portions is selective to the ARC and gate electrode layer. For example, the removal of the modified portions exposes the ARC layer over the second gate electrode layer. In one embodiment, the removal of the modified portions comprises a wet etch. The wet etch completely removes the modified portions without any nanocrystal remnants. In one embodiment, the wet etch comprises DHF and SC1 with megasonic process. The wet etch, for example, can be performed at about 40-60° C. for about 10-30 minutes. Other processes or wet etch process parameters may also be useful.

Figure 5H:
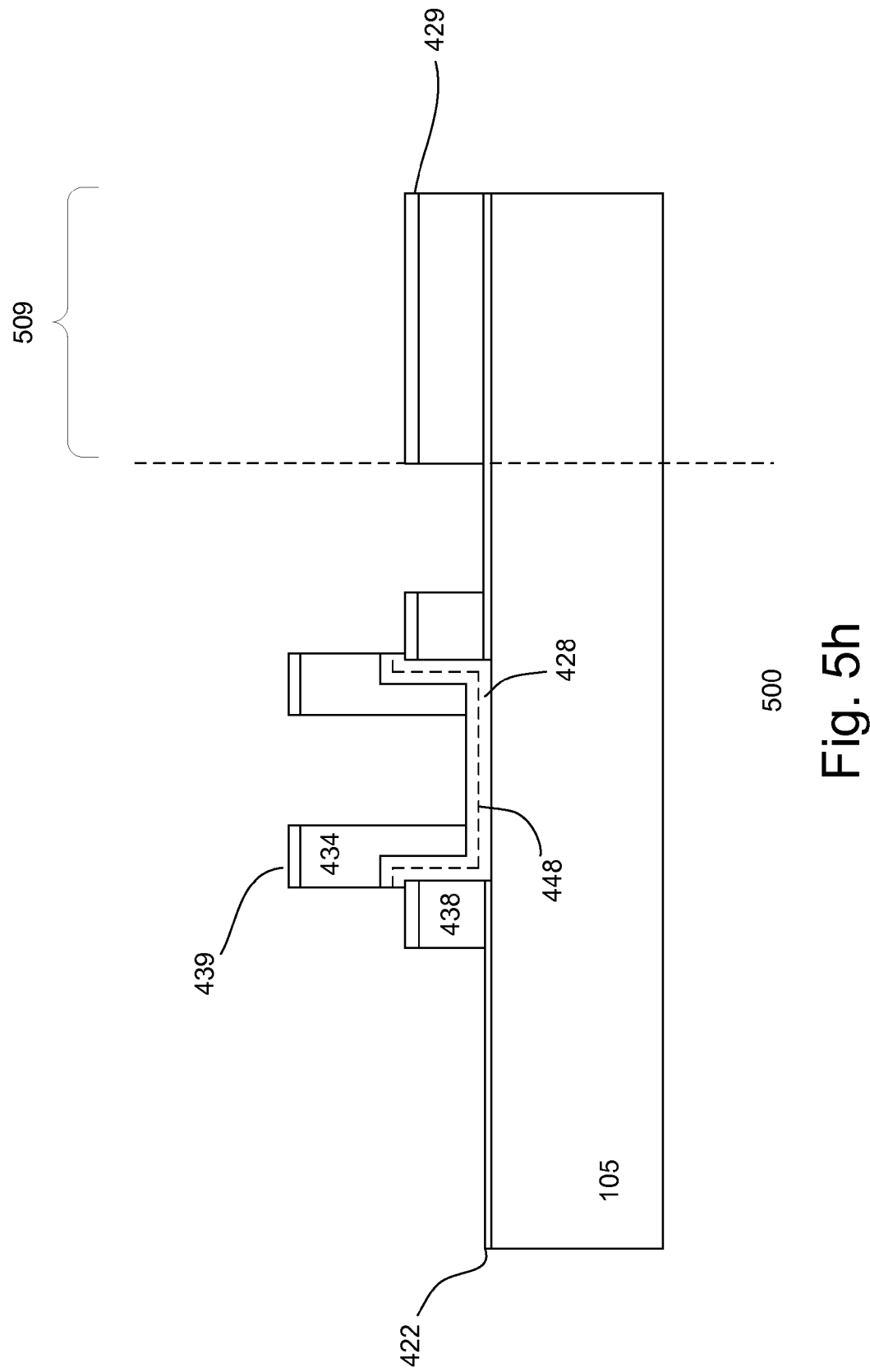

In FIG. 5h, the second gate electrode layer is patterned to form split gates of memory cells. In one embodiment, the second gate electrode layer is patterned to form split gates of adjacent memory cells. The second gate electrode layer is patterned, and the patterning is, for example, selective to oxide. The patterning of the second gate electrode layer exposes the inter-gate dielectric layer on the substrate between the split gates and the second gate dielectric layer adjacent to the split gates.

To pattern the second gate electrode, techniques such as mask and etch can be used. For example, a photoresist layer is formed over the substrate. An ARC layer can be provided beneath the photoresist. The photoresist layer can be selectively patterned by lithographic techniques. The pattern of the photoresist can be transferred to the layers beneath by, for example, an anisotropic etch such as RIE. The various layers beneath the photoresist can be patterned as desired. The photoresist layer is removed after forming the memory cells.

As shown, the device includes a logic region 509 in which non-memory cells are formed. The logic region, for example, comprises circuitry to facilitate accessing the memory cells. Other types of logic devices are also useful. In one embodiment, the gate electrode in the logic region is protected from the patterning process of the memory cells. In one embodiment, the logic gate electrode is the same as the second gate electrode. The logic gate electrode, for example, comprises an ARC layer thereover.

Figure 5I:
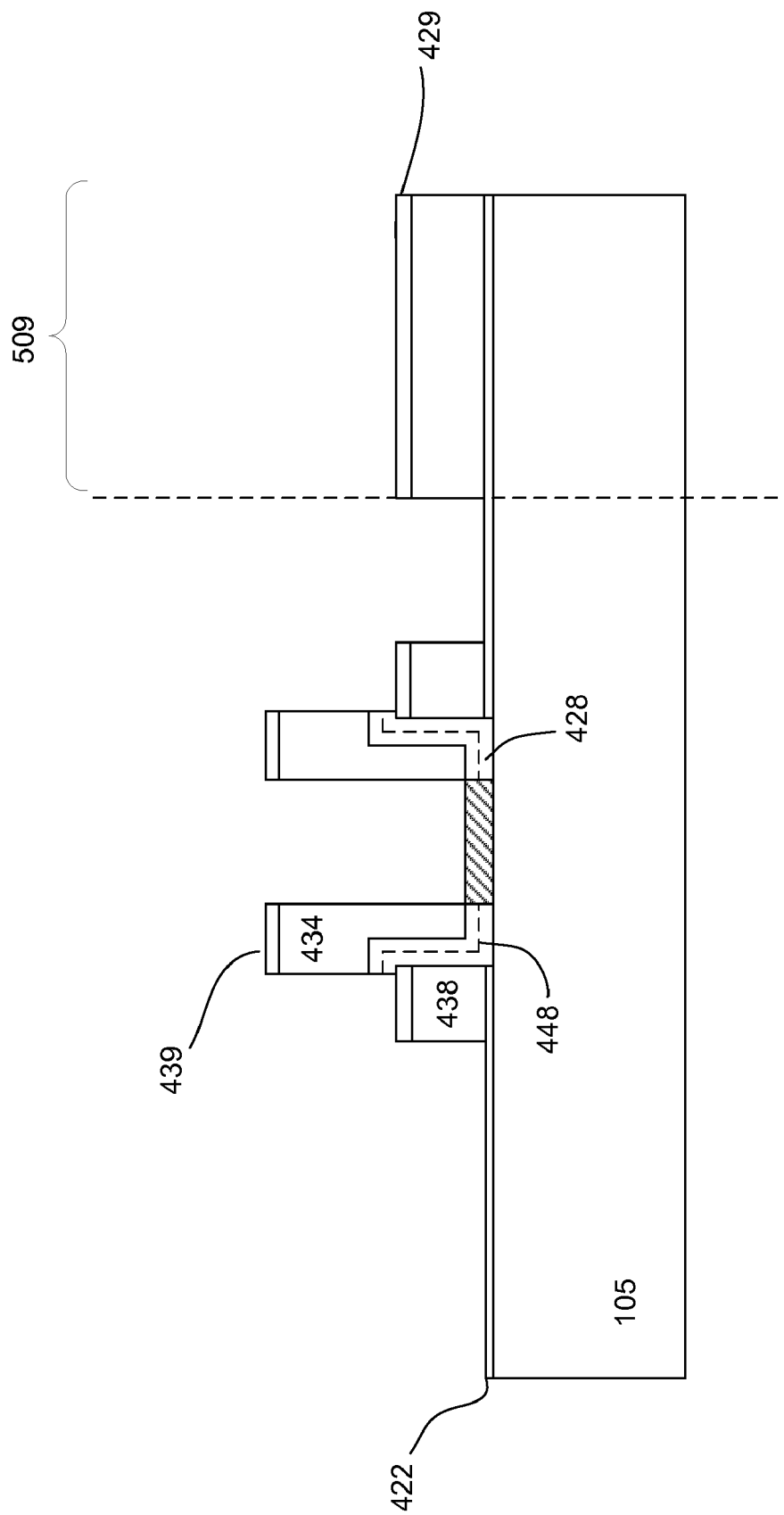
Figure 5I:
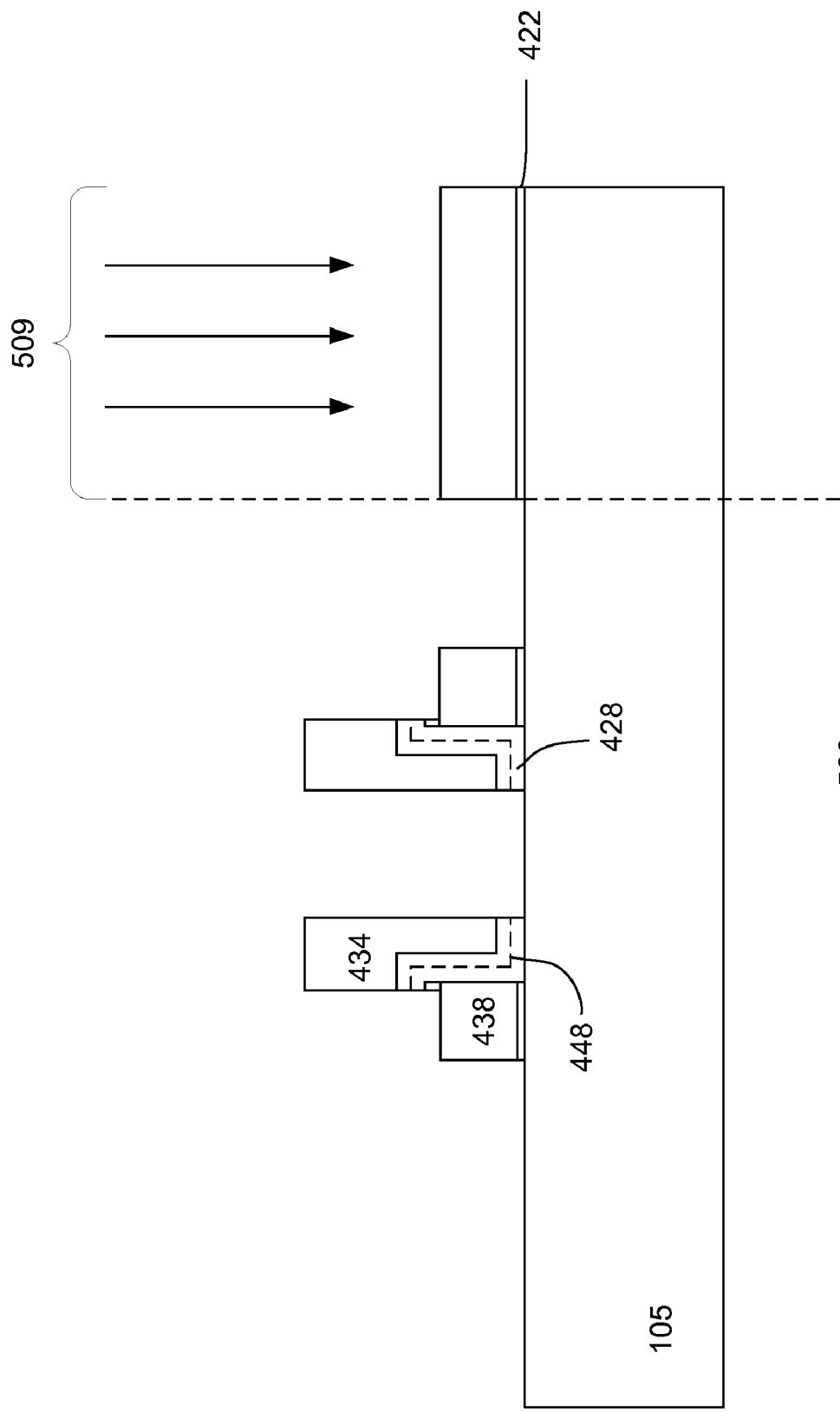

As shown in FIG. 5i, patterning of the first gate electrode layer exposes a portion of the inter-gate dielectric layer on the substrate where the first gate electrode layer has been removed. In one embodiment, the process continues by exposing the nanocrystals. For example, in the case of an inter-gate dielectric stack, the top oxide sub-layer is removed to expose the nanocrystals.

The substrate is subjected to processing to modify the exposed portion of the nanocrystal layer to form modified portions of the nanocrystal layer. In one embodiment, processing comprises oxidizing the exposed portions of the nanocrystal layer to at least reduce the size of the nanocrystals. Other types of processing to reduce the size of the nanocrystals may also be useful. Preferably, the processing at least reduces the size of the nanocrystals to a size below a threshold diameter to enable their removal without remnants. For example, the threshold diameter is about 15 nm. Other threshold diameters are also useful. In other embodiments, the exposed portion of the nanocrystal layer is oxidized to fully consume the nanocrystals. For example, the exposed portion is oxidized to form an oxide layer.

The processing, in one embodiment, comprises an oxidizing ambient, such as oxygen containing ambient. For example, the oxygen containing ambient can be oxygen ($O_2$) or ozone ($O_3$). In one embodiment, the processing comprises an ozone clean. The ozone clean can be performed at a temperature of about 400° C. to oxidize the nanocrystals. Processing the device layer using other ambients or temperatures is also useful.

FIG. 5j shows the removal of the modified portion of the dielectric nanocrystal layer. Removal of the modified portion of the dielectric nanocrystal layer is selective to the ARC gate electrode layer and substrate. For example, the removal of the oxidized dielectric nanocrystal layer exposes the substrate and leaves the ARC layer remaining over the gate electrode layers. In one embodiment, the removal of the modified portion comprises a wet etch. The wet etch completely removes the modified portion without any nanocrystal remnants. In one embodiment, the wet etch comprises DHF and SC1 with megasonic process. The wet etch, for example, can be performed at about 40-60° C. for about 10-30 minutes. Other processes or wet etch process parameters may also be useful.

The removal of the modified portion of the dielectric nanocrystal layer also removes exposed portions of the second gate dielectric layer to expose the substrate. The etch time should be selected to avoid undercutting of the unexposed second gate dielectric layer beneath the second gate electrode.

Referring to FIG. 5k, the ARC layer 439 on top of the first gate 434, second gate 438 and logic region 509 is removed. In one embodiment, the exposed ARC layer is removed prior to processing the logic region. For example, the exposed ARC layer is removed prior to logic poly implantation and logic poly etch. Removal of the ARC layer can be achieved by, for example, a global etch selective to silicon. The etch, for example, comprises a plasma etch. Other techniques can also be useful.

After removal of the ARC layer, the logic region is processed, as shown in FIG. 5l. To protect the memory region from being processed during processing of the logic region, a mask, such as a photoresist mask, can be used. In one embodiment, processing of the logic region comprises doping the gate electrode layer of the transistors therein. For example, dopants of a first polarity type are implanted into the gate electrode layer (indicated by arrows). The first polarity type can be n-type or p-type, depending on the transistor type. The first polarity type dopants are used for first polarity type transistors. For example, n+ dopants are used for n-type FETs while p+ dopants are used for p-type FETs. Other configurations of dopants and transistor types may also be useful. P-type dopants can include boron (B), aluminum (Al) or a combination thereof while n-type dopants can include phosphorus (P), arsenic (As), antimony (Sb) or a combination thereof. The dopant concentration can range about 1-9E15 $cm^{-2}$. Other dopant concentration ranges may also be useful.

In other embodiment, first and second dopant types can be implanted for first and second transistor types, forming a CMOS logic region. The first and second dopant types can be implanted using different implant processes. The dopants can be selectively implanted using implant masks.

After doping the gate electrode layer in the logic region 509, the gate electrode layer is patterned to form gates of transistors, as shown in FIG. 5m. Although only one gate is shown, it is understood that numerous gates may be formed in the logic region. The gates may include gates of both p-type and n-type transistors to form a complementary type device, such as a complementary metal oxide semiconductor (CMOS) device. Other configurations of gates are also useful.

Spacers 460 can be formed on sidewalls of the gates in the logic and memory regions. The spacers, for example, comprise a dielectric material such as silicon oxide and/or silicon nitride. Other types of dielectric materials may also be useful to form the spacers. Various techniques can be employed to form the spacers. For example, a spacer layer is deposited on the substrate and patterned to remove the horizontal portions of the spacer layer, leaving spacers on the sidewalls of the gates. In other embodiments, the spacers can be composite spacers with multiple layers. Other types of spacers are also useful.

Source and drain (source/drain) regions are formed for the transistors. In one embodiment, the source/drain regions are formed after forming the spacers. The source and drain regions are formed by, for example, ion implantation. First type source/drain regions and second type source/drain regions can be formed by separate implant processes. Other configurations of forming the source/drain regions are also useful. In some embodiments, lightly doped extensions (not shown) can be provided for the source/drain regions. The lightly doped extensions can be formed prior to forming the spacers.

The process continues to form the IC. For example, additional processing can include forming salicide contacts, filling gaps with dielectric material, forming one or more interconnect levels, final passivation, dicing, assembly and packaging. Other processes are also useful.

Figure 6A:
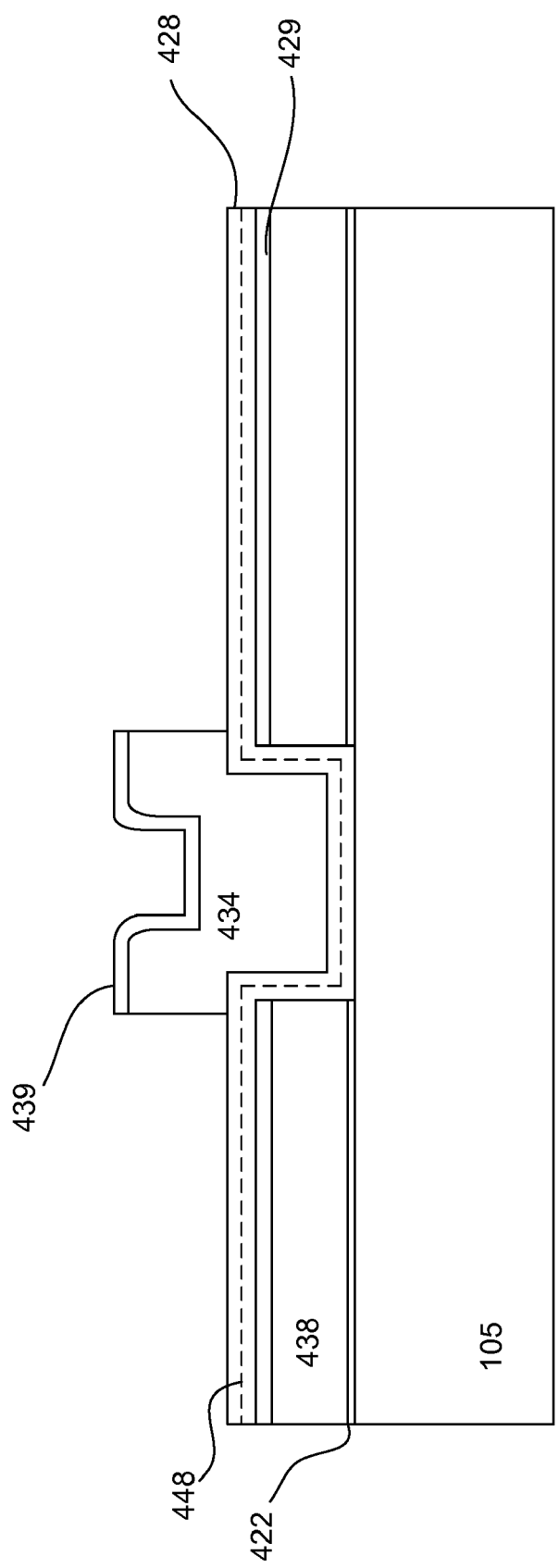
Figure 6B:
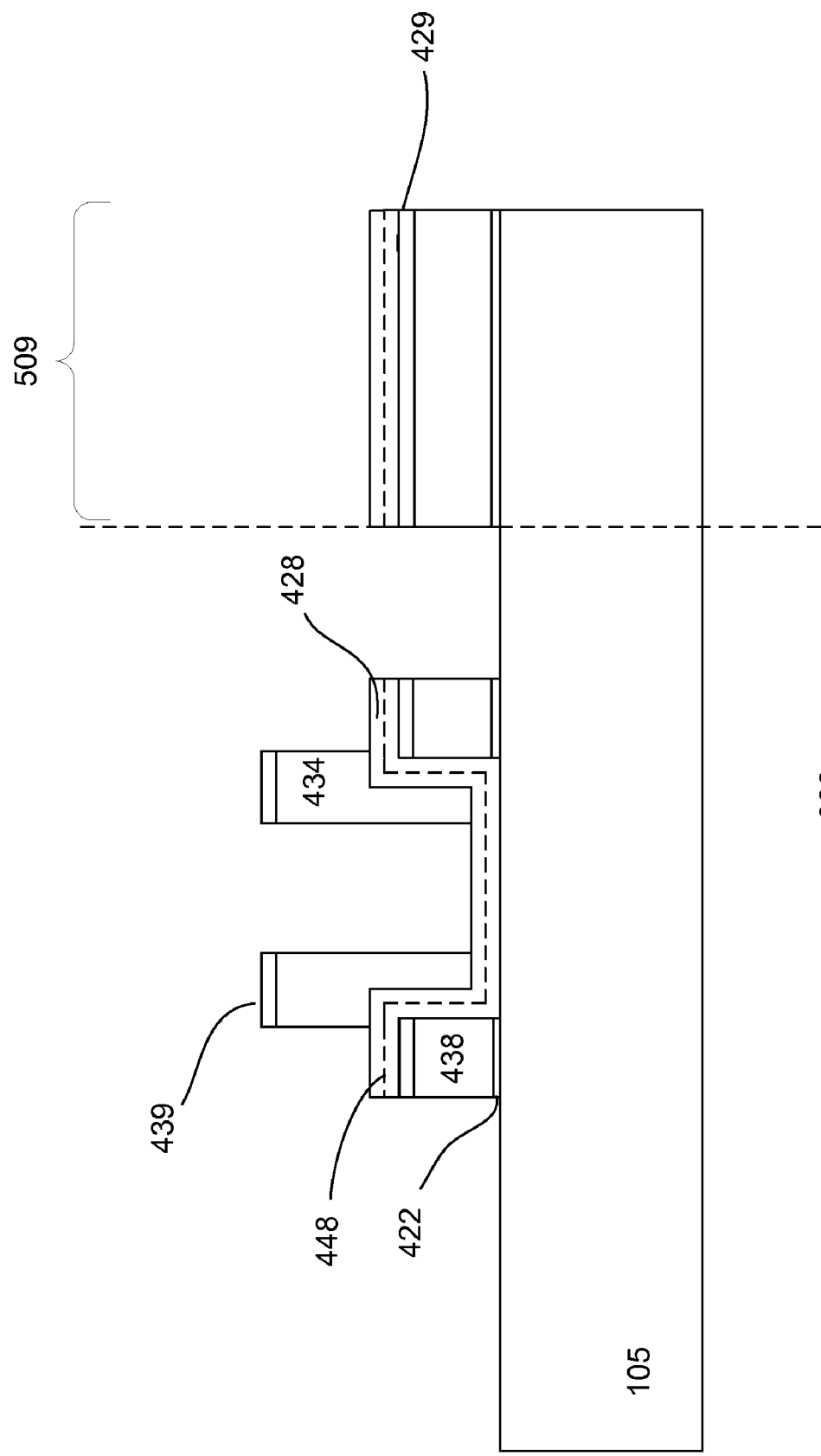

FIGS. 6a-d shows an alternative process. As shown in FIG. 6a, a device 600 is at a similar point of processing similar to that of FIG. 5e. Referring to FIG. 6b, the first and second gate electrode layers in the memory region are patterned to form split gates. Various techniques, such as mask and etch can be employed for patterning the substrate to form the split gates. Removing portions of the first gate electrode layer exposes portions of the inter-gate dielectric layer while removing portions of the second gate electrode layer exposes portions of the second gate dielectric layer. The mask also protects the logic region during patterning processes.

After patterning to form the split gates, the mask is removed. As shown in FIG. 6c, removing the mask exposes portions of the inter-gate dielectric layer and ARC layer. The logic region may also have the inter-gate dielectric layer over the ARC layer and gate electrode. In one embodiment, the process continues by exposing the nanocrystals. For example, in the case of an inter-gate dielectric stack, the top oxide sub-layer is removed to expose the nanocrystals.

The substrate is then subjected to processing to modify the exposed portion of the nanocrystal layer to form modified portions of the nanocrystal layer. In one embodiment, the processing comprises oxidizing the exposed portions of the nanocrystal layer to at least reduce the size of the nanocrystals. Other types of processing to reduce the size of the nanocrystals may also be useful. Preferably, the processing at least reduces the size of the nanocrystals to a size below a threshold diameter to enable their removal without remnants. For example, the threshold diameter is about 15 nm. Other threshold diameters are also useful. In other embodiments, the exposed portion of the nanocrystal layer is oxidized to fully consume the nanocrystals. For example, the exposed portion is oxidized to form an oxide layer.

The processing, in one embodiment, comprises an oxidizing ambient, such as oxygen containing ambient. For example, the oxygen containing ambient can be oxygen ($O_2$) or ozone ($O_3$). In one embodiment, the processing comprises an ozone clean. The ozone clean can be performed at a temperature of about 400° C. to oxidize the nanocrystals. Processing the device layer using other ambients or temperatures is also useful.

As shown in FIG. 6d, the modified portions of the dielectric nanocrystal layer in the memory and logic regions are removed. Removal of the modified portions of the dielectric nanocrystal layer is selective to the ARC, gate electrode layers and substrate. For example, the removal of the oxidized dielectric nanocrystal layer exposes substrate and leaves the ARC layer remaining over the gate electrode layers.

In one embodiment, the removal of the modified portion comprises a wet etch. The wet etch completely removes the modified portions without any nanocrystal remnants. In one embodiment, the wet etch comprises DHF and SC1 with megasonic process. The wet etch, for example, can be performed at about 40-60° C. for about 10-30 minutes. Other processes or wet etch process parameters may also be useful.

The removal of the modified portions of the dielectric nanocrystal layer exposes the substrate. In some embodiment, the removal of the modified portions also removes exposed portions of the second gate dielectric layer to expose the substrate. The etch time should be selected to avoid undercutting of the unexposed second gate dielectric layer beneath the second gate electrode. The process continues as described with respect to FIG. 5j and onwards.

As described, the ARC layer and nanocrystals are removed prior to processing the logic region. Furthermore, the nanocrystals are completely removed. Completely removing the nanocrystals and ARC layer prior to processing the logic region has been found to improve uniformity in gate electrode resistance variations across the wafer.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a semiconductor device comprising:
    providing a substrate prepared with first and second regions with a first device layer;
    forming a second device layer comprising nanocrystals;
    providing a cover layer over the second device layer, wherein the cover layer comprises a patterned cover layer which exposes a portion of the second device layer in the first region and exposes the second device layer in the second region;
    processing the exposed portions of the second device layer in the first and second regions to form modified portions, wherein processing at least reduces the nanocrystals to a diameter below a threshold diameter in the modified portions;
    removing the modified portions; and
    processing the second region after removing the modified portions.

2. The method of claim 1 wherein the modified portions are removed without leaving nanocrystal remnants.

3. The method of claim 1 wherein:
the second region comprises a second region gate electrode layer with an anti-reflective coating over the second region gate electrode layer; and
further comprises removing the anti-reflective coating after removing the modified portions and prior to processing the second gate electrode layer in the second region.

4. The method of claim 3 wherein the first region is patterned to form a split gate structure of a memory cell with first and second sub-gates, wherein:
the second sub-gate is separated from the substrate by a second sub-gate dielectric; and
the first sub-gate is separated from the substrate and the second sub-gate by the second device layer.

5. The method of claim 1 wherein:
the first region comprises an array region while the second region comprises a logic region;
the second region comprises a second region gate electrode layer with an anti-reflective coating over the second region gate electrode layer; and
further comprises removing the anti-reflective coating after removing the modified portions and prior to processing the second gate electrode layer in the second region.

6. The method of claim 5 wherein the array region is patterned to form a split gate structure of a memory cell with first and second sub-gates, wherein:
the second sub-gate is separated from the substrate by a second sub-gate dielectric; and
the first sub-gate is separated from the substrate and the second sub-gate by the second device layer.

7. The method of claim 5 wherein the first region is patterned to form a split gate structure of a memory cell with first and second sub-gates, wherein:
the second sub-gate is separated from the substrate by a second sub-gate dielectric; and
the first sub-gate is separated from the substrate and the second sub-gate by the second device layer.

8. The method of claim 7 wherein:
the first sub-gate can serve as the patterned cover layer; and
the first device layer serves as the second sub-gate and a second region gate electrode layer in the second region.

9. The method of claim 7 wherein the first gate partially overlaps the second gate.

10. The method of claim 7 wherein the first gate comprises a control gate and the second gate comprises a select gate and the second device layer serves as a storage layer of the memory cell.

11. The method of claim 1 wherein the second device layer comprises silicon nanocrystals.

12. The method of claim 11 wherein processing of the second region comprises implanting ions into the gate electrode layer.

13. The method of claim 11 wherein forming the modified portions comprises an oxidizing ambient.

14. The method of claim 13 wherein the oxidizing ambient comprises oxygen or ozone.

15. The method of claim 13 wherein the oxidizing ambient oxidizes the nanocrystals.

16. The method of claim 13 wherein the oxidizing ambient completely or partially oxidizes the nanocrystals.

17. The method of claim 11 wherein removing the modified portions comprises a wet etch.

18. The method of claim 11 wherein removing the modified portions comprises a DHF and SC1 with megasonic.

19. The method of claim 1 wherein forming the modified portions comprises an oxidizing ambient.

20. A method for forming a device comprising:
providing a substrate;
forming a nanocrystal device layer on the substrate;
processing the nanocrystal device layer to form a processed nanocrystal device layer wherein the nanocrystals are converted to a dielectric material; and
removing the processed nanocrystal device layer using a wet etch.

* * * * *